United States Patent
Sasaki et al.

(10) Patent No.: US 9,825,155 B2
(45) Date of Patent: Nov. 21, 2017

(54) MAGNETORESISTIVE ELEMENT AND SPIN-TRANSPORT ELEMENT

(71) Applicant: TDK CORPORATION, Tokyo (JP)

(72) Inventors: Tomoyuki Sasaki, Tokyo (JP); Tohru Oikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/038,281

(22) PCT Filed: Nov. 19, 2014

(86) PCT No.: PCT/JP2014/080636
§ 371 (c)(1),
(2) Date: May 20, 2016

(87) PCT Pub. No.: WO2015/076298
PCT Pub. Date: May 28, 2015

(65) Prior Publication Data
US 2016/0293740 A1    Oct. 6, 2016

(30) Foreign Application Priority Data

Nov. 20, 2013  (JP) ................................ 2013-239734

(51) Int. Cl.
*H01L 29/66* (2006.01)
*G01R 33/09* (2006.01)
(Continued)

(52) U.S. Cl.
CPC ...... *H01L 29/66984* (2013.01); *G01R 33/098* (2013.01); *G11C 11/161* (2013.01);
(Continued)

(58) Field of Classification Search
CPC ... H01L 29/66984; H01L 29/82; H01L 43/08; H01L 43/12; H01L 29/0895; G11C 11/16
See application file for complete search history.

(56) References Cited

U.S. PATENT DOCUMENTS 5,512,771 A * 4/1996 Hiroki ............. H01L 21/823857
                                                        257/336
8,779,496 B2 * 7/2014 Saito ..................... B82Y 10/00
                                                        257/213
(Continued)

FOREIGN PATENT DOCUMENTS

JP  2006-032915 A    2/2006
JP  2010-226063 A   10/2010
(Continued)

OTHER PUBLICATIONS

Sasaki et al., "Comparison of spin signals in silicon between nonlocal four-terminal and three terminal methods", Applied Physics Letters 98, 012508, 2011, pp. 1-3.*
(Continued)

*Primary Examiner* — Tom Thomas
*Assistant Examiner* — Vincent Wall
(74) *Attorney, Agent, or Firm* — Oliff PLC

(57) ABSTRACT

The magnetoresistive element includes a semiconductor channel layer, a pinned layer disposed on the semiconductor channel layer via a first tunnel layer, a free layer disposed on the semiconductor channel layer via a second tunnel layer, wherein the semiconductor channel layer includes a first region containing an interface with the first tunnel layer, a second region containing an interface with the second tunnel layer, and a third region, impurity concentrations in the first and second regions are higher than $1 \times 10^{19}$ cm$^{-3}$, an impurity concentration in the third region is $1 \times 10^{19}$ cm$^{-3}$ or less, the first and second regions are separated by the third region, and the impurity concentrations in the first and second regions decrease in the thickness direction of the semiconductor channel layer from the interface between the semiconductor channel layer and the first tunnel layer and the
(Continued)

interface between the semiconductor channel layer and the second tunnel layer.

9 Claims, 13 Drawing Sheets

(51) Int. Cl.
　　　H01L 29/82　　　(2006.01)
　　　G11C 11/16　　　(2006.01)
　　　H01L 43/08　　　(2006.01)
　　　H01L 43/12　　　(2006.01)
　　　H01L 29/08　　　(2006.01)
　　　G11B 5/39　　　 (2006.01)

(52) U.S. Cl.
　　　CPC ...... *H01L 29/0843* (2013.01); *H01L 29/0895* (2013.01); *H01L 29/82* (2013.01); *H01L 43/08* (2013.01); *H01L 43/12* (2013.01); *G11B 5/3909* (2013.01); *G11B 2005/3996* (2013.01)

(56) References Cited

U.S. PATENT DOCUMENTS

| | | | | |
|---|---|---|---|---|
| 9,728,713 | B2* | 8/2017 | Sasaki | ............ H01L 43/08 |
| 2005/0282379 | A1 | 12/2005 | Saito et al. | |
| 2006/0114018 | A1 | 6/2006 | Sugahara et al. | |
| 2009/0050948 | A1 | 2/2009 | Ishikawa et al. | |
| 2009/0057654 | A1* | 3/2009 | Saito | ............ B82Y 25/00 |
| | | | | 257/39 |
| 2010/0244897 | A1 | 9/2010 | Saito et al. | |
| 2010/0314702 | A1* | 12/2010 | Sasaki | ............ G11C 11/16 |
| | | | | 257/421 |
| 2012/0056254 | A1* | 3/2012 | Sasaki | ............ H01L 29/66984 |
| | | | | 257/295 |
| 2012/0267734 | A1* | 10/2012 | Sasaki | ............ H01L 29/82 |
| | | | | 257/421 |
| 2015/0001601 | A1* | 1/2015 | Koike | ............ H01L 43/02 |
| | | | | 257/295 |

FOREIGN PATENT DOCUMENTS

| | | |
|---|---|---|
| JP | 2010-287666 A | 12/2010 |
| JP | 2012-227439 A | 11/2012 |
| WO | 2004/086625 A1 | 10/2004 |

OTHER PUBLICATIONS

Feb. 3, 2015 International Search Report issued in International Patent Application No. PCT/JP2014/080636.
Feb. 3, 2015 Written Opinion issued in International Patent Application PCT/JP2014/080636.
Tomoyuki Sasaki et al; "Comparison of spin signals in silicon between nonlocal four-terminal and three-terminal methods;" Applied Physics Letters; Jan. 6, 2011; vol. 98; pp. 1-3.
A. Fert et al; "Conditions for efficient spin injection from a ferromagnetic metal into a semiconductor;" Physical Review B; Oct. 19, 2001; vol. 64; pp. 1-9.
Toshio Suzuki et al; "Room-temperature electron spin transport in a highly doped Si channel;" Applied Physics Express; Feb. 7, 2011; vol. 4; pp. 1-3.
Tomoyuki Sasaki et al; "Spin transport in nondegenerate Si with a spin mosfet structure at room temperature;" Physical Review Applied; Sep. 10, 2014; vol. 2; pp. 1-6.
Jun. 2, 2017 Extended European Search Report issued in European Patent Application No. 14864199.6.

* cited by examiner

MAGNETORESISTIVE ELEMENT AND SPIN-TRANSPORT ELEMENT

The present invention relates to a magnetoresistive element, a Spin-MOSFET (spin-metallic, oxide semiconductor field effect transistor) and a spin-transport element.

BACKGROUND

The magnetoresistance effect generated by the spin polarized current flowing between the ferromagnetic electrodes through the nonmagnetic layer is great and thus is referred to as giant magnetoresistance effect (GMR) There are products such as magnetic heads and the sensors to which such an effect is applied. In addition, it is well known that the effect generated in a configuration in which a tunnel film is used instead of a nonmagnetic layer is referred to as tunneling magnetoresistance effect (TMR), and a characteristic better than GMR can be obtained. These elements are passive elements in which outputs are generated based on a relative spin angle between the ferromagnetic electrodes. When the antimagnetic layer is used as a semiconductor, there is an amplifying function in the semiconductor in addition to the magnetoresistance effect. Thus, active elements in spintronics have attracted attention. In Patent Documents 1 and 2, Spin-MOSFET is proposed in which magnetoresistance effect generated by spin polarized current flowing through a semiconductor is used.

In Non-Patent Document 1, there is a proposal that since spin is transported through the semiconductor, the tunnel film is inserted into the interface between the ferromagnetic body and the semiconductor considering to problem of conductivity mismatch. Actually, it is hard to introduce and transport the spin in the semiconductor layer if only the tunnel film is inserted. It relates to the increase of the element resistance of the entire circuit to insert the tunnel film so as to solve the problem of conductivity mismatch. Thus, it is hard to provide a giant magnetoresistance ratio.

There are two main reasons for the absence of a giant magnetoresistance ratio. One is a problem of spin attenuation associated with the spin dependent scattering in the vicinity of the interface between the ferromagnetic body and the semiconductor. The other is a problem concerning the design of the resistance.

The lower the carrier concentration is in the semiconductor channel layer, the easier the spin is accumulated and transported in the semiconductor channel layer. Spin transport distance is determined by the spin life referring to the average time during which spin continues until it attenuates and lose the spin polarization, and the diffusion coefficient with which the spin diffuses and transports. That is, the higher the electrical resistance of the spin-transport element is, the easier the spin is transported. On the other hand, the lower the resistance of the spin-transport element is, the easier the spin is introduced, and the speed can be higher and less energy will be used. Thus, in order to realize a spin-transport element in which high speed and energy saving is achieved while keeping good conductivity of spin, a contradiction concerning the electrical resistance property of the spin-transport element occurred.

PATENT DOCUMENTS

Patent Document 1: WO2004/086625
Patent Document 2: JP-A-2006-32915
Patent Document 3: JP-A-2010-287666

NON-PATENT DOCUMENTS

Non-Patent Document 1: A. Fert and H. Jaffhes, Physical Review B VOLUME 64, 184420 (2001)

Non-Patent Document 2: T. Sasaki, T. Oikawa, M. Shiraishi, Y. Suzuki and Knoguchi, Applied Physics Express 4 (2011) 023003

SUMMARY

In order to decrease the element resistance of the entire circuit while inserting the tunnel film so as to solve the problem of conductivity mismatch, a method is proposed to increase the impurity concentration in the semiconductor layer close to the interface between the semiconductor layer and the ferromagnetic layer. This method is used to decrease Schottky barrier generated at the interface between the semiconductor layer and the ferromagnetic layer and to decrease the resistance at the interface. This method is described in, for example, Patent Document 3. However, if the impurity concentration is increased, the spin can be hardly transported and the spin output will decrease. In addition, due to the introduction of the impurities, the crystalline of the semiconductor will decrease, and it will also cause a decrease in the spin output. Further, if a maximum value of impurity concentration exists in the side of the semiconductor channel layer from the interface of the semiconductor layer with the ferromagnetic layer, an energy level at which the spin is easy to attenuate will be formed from the interface to the site where the maximum value of impurity concentration exists. If the energy level at which the spin is easy to attenuate is formed in this way in the vicinity of the interface, where the impurity concentration is high, the transport property of the spin will deteriorate and the spin output will decrease, because the spin will attenuate during its movement in the semiconductor channel layer.

In order to obtain a high magnetoresistance ratio, it is necessary to get both low element resistance and high spin output. However, as for the conventional element in which the spin is transported in the semiconductor, it is difficult to achieve both of the two aspects due to the Schottky barrier and the spin scattering at the interface between the metal and the semiconductor.

In order to solve the technical problem mentioned above, the magnetoresistive element of the present invention is characterized in comprising a semiconductor channel layer, a pinned layer disposed on the semiconductor channel layer via a first tunnel layer, a free layer disposed on the semiconductor channel layer via a second tunnel layer, wherein the semiconductor channel layer substantially consists of a first region containing the interface with the first tunnel layer, a second region containing the interface with the second tunnel layer, and a third region, the impurity concentrations in the first region and the second region are over $1 \times 10^{10}$ $cm^{-3}$, the impurity concentration in the third region is $1 \times 10^{19}$ $cm^{-3}$ or less, the first region and the second region are separated by the third region, and the impurity concentrations in the first region and the second region decrease monotonically in the thickness direction of the semiconductor channel layer from the interface between the semiconductor channel layer and the first tunnel layer and the interface between the semiconductor channel layer and the second tunnel layer, respectively. With such a configuration, due to the existence of the first region and the second region with a high concentration of impurity, low interface resistances (i.e., resistances at the interface between the semiconductor channel layer and the first tunnel layer or the second tunnel layer) can be realized, and a low element resistance can be realized. Further, energy levels at which the spin is easy to attenuate will not be generated in the first region and the second region with high impurity concentrations, and the spin may be transported in the third region with a low impurity concentration. Thus, the attenuation of the spin in the semiconductor channel layer will be suppressed, and the deterioration of the spin transport property will be suppressed. Thereby, a high magnetoresistance ratio can be provided.

Here, the expression that "the semiconductor channel layer substantially consists of the first region, the second region and the third region" means not only the case that the semiconductor channel layer consists of only the first region, the second region and the third region, but also the case that a part with a higher concentration of the impurity than the third region exists in the part that does not substantially relate to the spin transport in the semiconductor channel layer.

As for the expression that the impurity concentration monotonically decreases, it means the impurity concentration does not increase, but decreases or does not change. However, in the analysis of the impurity concentration, since the background noise in the determination is contained, the case that the impurity concentration is decreasing, from the tendency of before and after even if the concentration increases in local parts due to the noise is included in that it monotonically decreases.

Further, in the magnetoresistive element of the present invention, it is preferable that the first region and the second region have a thickness of 10 nm or less. If the first region and the second region are thick, the spin will attenuate in the first region and the second region and the spin transport property will deteriorate.

In the magnetoresistive element of the present invention, it is also preferable that the semiconductor channel layer is provided with a first projection part and a second projection pan, wherein the first region is contained in the first projection part and the second region is contained in the second projection part. As the first region and the second region are disposed in the projection parts of the semiconductor channel layer, the diffusion of the spin in the direction perpendicular to the conducting direction of the spin polarized current can be inhibited, and an effect will be provided that a high magnetoresistance ratio is obtained.

Further, in the magnetoresistive element of the present invention, it is preferable that the highest impurity concentration ranges from $2\times10^{19}$ cm$^{-3}$ to $2\times10^{20}$ cm$^{-3}$ in the first region and the second region. In this way, the interface resistance can be suppressed, and the spin transport property can be prevented from deteriorating.

In the magnetoresistive element of the present invention, it is preferable that the third region contains a fourth region in which a gate voltage is applied, and the impurity concentration is $3\times10$ cm$^{-3}$ or less in the fourth region. When the carrier is induced by the potential change in the gate voltage, the magnetoresistive element of the present invention will function as a MOSFET. The fourth region of the semiconductor channel layer in which a gate voltage is applied is desired to have a large ON/OFF ratio based on the gate voltage. If the impurity concentration in the fourth region of the semiconductor channel layer is $3\times10^{19}$ cm$^{-3}$ or less, the ON/OFF ratio based on the gate voltage will become large, in addition, if the impurity concentration in the fourth region is $3\times10^{18}$ cm$^{-3}$ or less, the fourth region will function as a non-degenerate semiconductor and the electrical conductivity will diffuse and drift. In this way, the spin may be well transported along with the electric charges. Further, as the concentration of the electrons decreases due to the effect of the gate, the spin will hardly attenuate, and a good spin transport will be possible.

Preferably, in the magnetoresistive element of the present invention, the impurity concentration in the third region and the fourth region is decreasing as its location is getting away from the first region and the second region. Alternatively the impurity concentration does not increase in the third region and the fourth region even the region is away from the first region and the second region. If the third region and the fourth region have a configuration that there is a peak value in the impurity concentration, the influence will be smaller than that in the case of the first region and the second region with a high concentration of impurity concentration. However, as region in which the spin is likely to attenuate will be formed in the part where the peak is present, which is disadvantageous for the spin transport property. The higher the impurity concentration is, the easier the spin is scattered and attenuates Thus, in order to suppress the attenuation of spin caused by the scattering, the impurity concentration is preferably low in the semiconductor channel layer. Since the impurity concentration is decreasing in the third region and the fourth region as the location is getting away from the first region and the second region, the spin will reach a region with a sufficiently low concentration of the impurity where the spin is likely to be affected by the gate voltage. Thus, the increase of the spin output is possible. In addition, it is also possible to adjust the spin output by the gate voltage effect.

In the analysis of the impurity concentration, since the background noise in the determination is contained, the case that the impurity concentration is decreasing or is not increasing from the tendency of before and after even if the concentration increases in local parts due to the noise is included in that 'the impurity concentration is decreasing as the location is getting away from the first region and the second region' or that 'the impurity concentration does not increase even the location is away from the first region and the second region'.

Further, in the magnetoresistive element of the present invention, it is preferable that the areal resistance between the pinned layer and the first region and the areal resistance between the free layer and the second region are lower than $1\times10^6$ Ω·μm$^2$. As the resistance value constitutes the background in the magnetoresistive element, the resistance is preferably low to decrease the background. However, if the thickness of the tunnel layer increases, the spin output will increase as the spin polarization will become high.

Here, the areal resistance (RA) is represented by the product of the resistance (Ω) and the area in the cross-section perpendicular to the direction of current (μm$^2$). That is, the resistance is obtained by dividing the areal resistance by the cross-sectional area. The areal resistance between the pinned layer and the first region is the product of the resistance between the pinned layer and the first region and the area of the interface between the first tunnel layer and the pinned layer. The areal resistance between the free layer and the second region is the product of the resistance between the free layer and the second region and the area of the interface between the second tunnel layer and the free layer.

The magnetoresistive element of the present invention can be applied to Spin-MOSFETs, magnetic heads, spin transistors, memories, sensors, and logic circuits, and the like.

The Spin-MOSFET of the present invention is characterized in using the magnetoresistive element mentioned above.

Further, the spin-transport element using pure spin current of the present invention is characterized in comprising the magnetoresistive element mentioned above, a first reference electrode made of non-magnetic material that is disposed closer to the pinned layer at the outer side of the pinned layer and the free layer, and a second reference electrode made of non-magnetic material that is disposed closer to the free layer at the outer side of the pinned layer and the free layer. Thereby, the spin-transport element using pure spin current can be provided.

According to the present invention, a magnetoresistive element with a high magnetoresistance ratio can be provided. In addition, a Spin-MOSFET and a spin-transport element using this magnetoresistive element can be provided.

DETAILED DESCRIPTION OF EMBODIMENTS

Hereinafter, the embodiments of the present invention will be described with reference to the drawings. The following description illustrates part of the embodiments in the present invention, and the present invention is not intended to be limited to these embodiments. The embodiments involving the technical concept of the present invention will necessarily fall within the scope of the present invention. The configuration in each embodiment and the combination thereof are only examples of the present invention. The constituent element can be added, omitted, substituted or subject to other modifications without departing from the spirit and the scope of the present invention. Further, the same reference refers to the same element throughout the description of the drawings, and repeated description will be omitted.

First Embodiment

Figure 1:
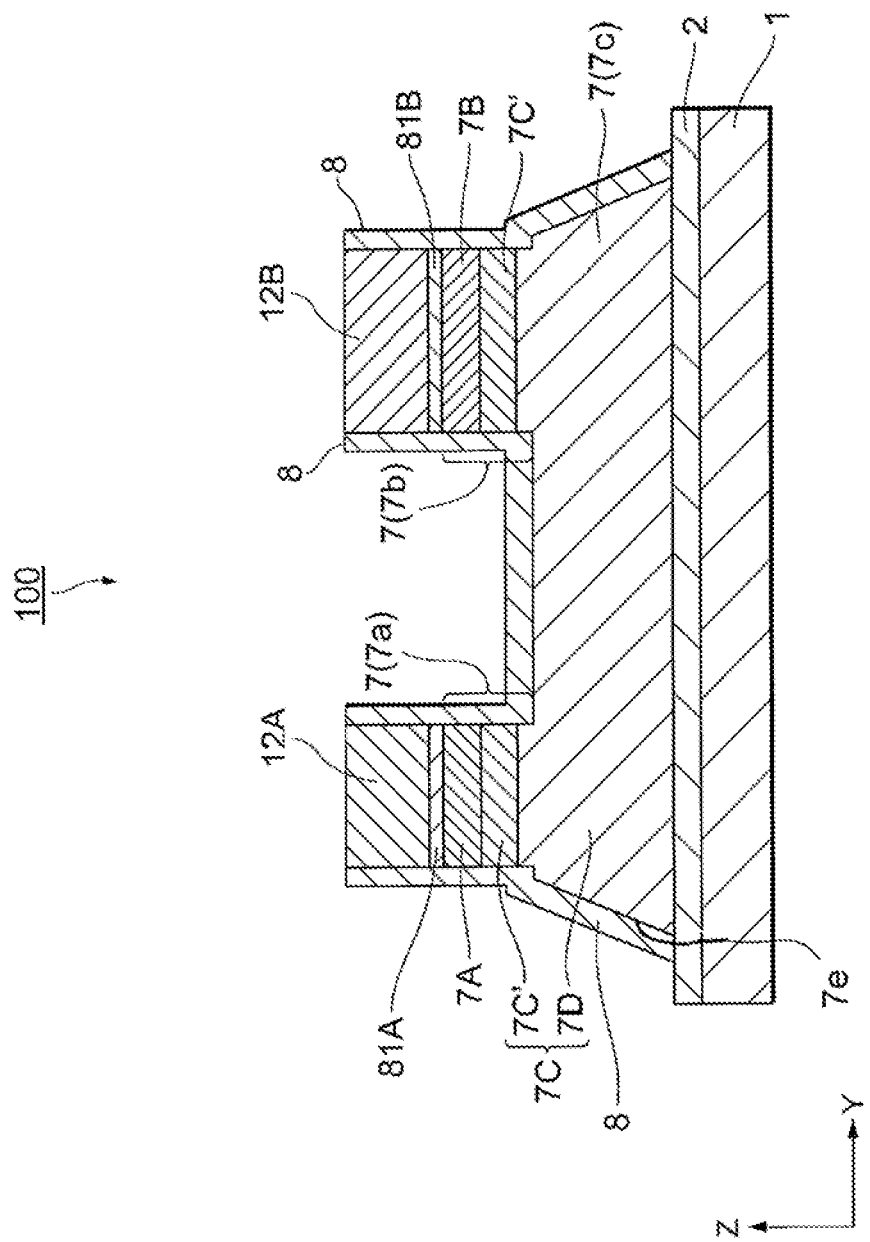
FIG. 1 is a cross-sectional view showing the magnetoresistive element according to the first embodiment.

FIG. 1 is a cross-sectional view showing magnetoresistive element 100 according to the first embodiment.

As shown in FIG. 1, magnetoresistive element 100 is provided with silicon substrate 1, silicon oxide layer 2, and silicon channel layer 7 as the semiconductor channel layer. Silicon oxide film 2 and silicon channel layer 7 are disposed on silicon substrate 1 in said order. The material for silicon channel layer 7 is Si and also contains impurities for adjusting the concentration of the carrier. The substrate such as SOI (Silicon On Insulator) substrate can be used in silicon substrate 1, silicon oxide film 2 and silicon channel layer 7. The side walls 7e of silicon channel layer 7 incline, and the surface of silicon channel layer 7 is covered with insulating layer 8, In addition, silicon channel layer 7 is provided with first projection part 7a and second projection part 7b, Magnetoresistive element 100 includes first tunnel layer 81A and pinned layer 12A which is disposed with first tunnel layer 81A interposed on first projection pan 7a. Similarly, magnetoresistive element 100 includes second tunnel layer 81B and free layer 12B which is disposed with second tunnel layer 81B interposed on second projection part 7h. As shown in FIG. 1, pinned layer 12A and free layer 12B are separated from each other by silicon channel layer 7. The side walls of all of first tunnel layer 81A, second tunnel layer 81B, pinned layer 121 and free layer 12B are covered with insulating layer 8. As shown in FIG. 1, silicon channel layer 7 is composed of first region 7A including the interface with first tunnel layer 81A, second region 7B including the interface with second tunnel layer 81B, and third region 7C. In magnetoresistive element 100, as shown in FIG. 1, first region 7A contains the region right under pinned layer 12A, second region 7B contains the region right under free layer 12B, and first region 7A and second region 7B are separated from each other by third region 7C, The impurity concentration is over $1 \times 10^{19}$ cm$^{-3}$ in first region 7A and second region 7B, and the impurity concentration is $1 \times 10^{19}$ cm$^{-3}$ or less in third region 7C. Third region 7C contains fourth region 7D with an impurity concentration of $3 \times 10^{18}$ cm$^{-3}$ or less, and as shown in FIG. 1, consists of region 7C' (the region with an impurity concentration of over $3 \times 10^{18}$ cm$^{-3}$ and not higher than $1 \times 10^{19}$ cm$^{-3}$) and fourth region 7D. In first region 7A and second region 7B of magnetoresistive element 100, the impurity concentrations decrease monotonically in the thickness direction of silicon channel layer 7 from the interface between silicon channel layer 7 and first tunnel layer 81A and the interface between silicon channel layer 7 and second tunnel layer 81B, respectively.

As shown in FIG. 1, silicon channel layer 7 has incline parts at the side faces with an inclining angle θ of 50° to 60°. Here, the inclining angle θ refers to the angle formed between the bottom part and the side face of silicon channel layer 7. Silicon channel layer 7 can be formed by wet etching, and the top face of silicon channel layer 7 is preferably the (100) face.

The film thickness is preferably 3 nm or lower in first tunnel layer 81A and second tunnel layer 81B from the view of suppressing the increase of the resistance and making them function as the tunnel insulating layers. In addition, the film thickness is preferably 0.4 nm or more considering one atomic layer thickness in first tunnel layer 81A and second tunnel layer 81B from the view of making them function as the tunnel insulating layers. As the material for first tunnel layer 81A and second tunnel layer 81B, for example, magnesium oxide can be used. When magnesium oxide is used as the material for first tunnel layer 81A and second tunnel layer 81B, the efficiency in spin introduction is improved.

Pinned layer 12A and free layer 12B are made of ferromagnetic material. As the material for pinned layer 12A and free layer 12B, for instance, the metal selected from the group consisting of Ti, V, Cr, Mn, Co, Fe and Ni, the alloy containing at least one element from said group, or the alloy containing at least one element selected from said group and at least one element selected from the group consisting of B, C and N are included. As these materials are soft magnetic material, the function as free layer 12B can be appropriately realized by using them. In addition, as these materials are ferromagnetic material with a high spin polarization ratio, the function as pinned layer 12A can be appropriately realized by using them.

Insulating layer is disposed on the side faces of silicon channel layer 7. Also, insulating layer 8 is disposed on the top face of silicon channel layer 7. Insulating layer 8 is disposed on silicon channel layer 7 in the region between first tunnel layer 81A and second tunnel layer 81B.

Silicon channel layer 7, first tunnel layer 81A, second tunnel layer 81B, pinned layer 12A and free layer 12B can be protected by insulating layer 8, and their deterioration can be suppressed. Insulating layer 8 can be used as the silicon oxide film. The silicon oxide film is suitable as a protective film. In addition, the silicon oxide film can be easily manufactured on silicon channel layer 7 made of silicon.

Figure 2:
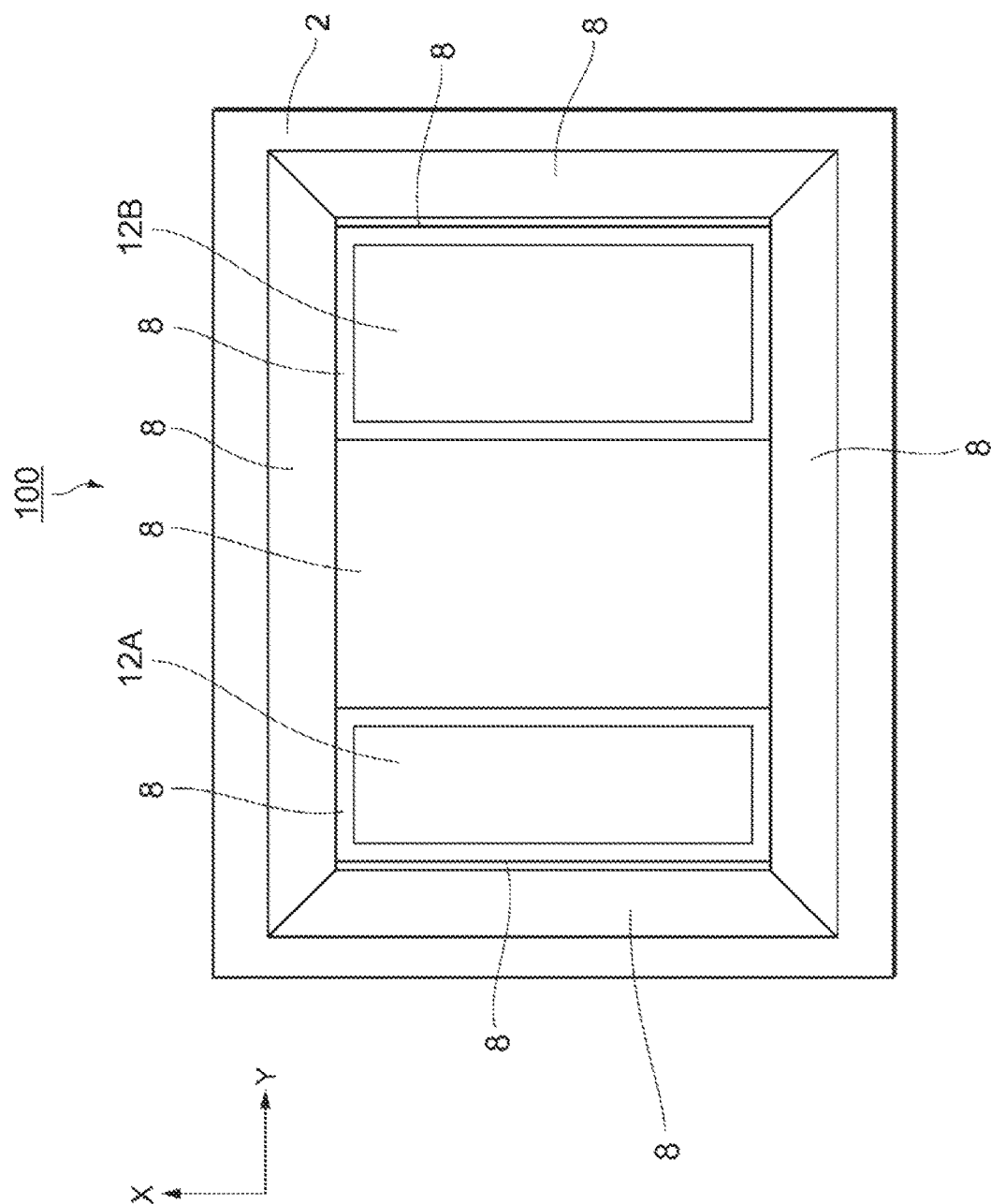
FIG. 2 is a view of the magnetoresistive element of FIG. 1 viewed from the Z direction.

FIG. 2 is a view showing the configuration of FIG. 1 when viewed in the Z direction. As shown in FIG. 2, silicon channel layer 7 has a rectangular shape with its major axis in the Y direction. Pinned layer 12A and free layer 12B have a rectangular shape with the major axis in the X direction, respectively. With respect to the width in the Y direction, the width of free layer 12B is larger than that of pinned layer 12A. Pinned layer 12A and free layer 12B are provided with a difference in reversed magnetic field as they have different aspect ratios of X direction and direction. As such, pinned layer 12A and five layer 12B are provided with a difference in coercivity due to the shape anisotropy wherein pinned layer 12A has larger coercivity than free layer 12B.

Further, silicon is used as the semiconductor material for silicon substrate 1, silicon oxide film 2 and silicon channel layer 7 in the present embodiment. However, the material is not limited to silicon. For example, as the semiconductor material, the compound of silicon and germanium, gallium arsenide and the like can also be listed as the candidate.

The current flows to the region between pinned layer 12A and free layer 12B through silicon channel layer 7, and the magnetoresistance effect can be observed based on the relative angle between the magnetization orientation of pinned layer 12A and that of free layer 12B.

In magnetoresistive element 100, there is a distribution in the impurity concentration in silicon channel layer 7. Magnetoresistive element 100 has a configuration in which the impurity concentration of silicon channel layer 7 is highest at the interface of first region 7A with first tunnel 8A and the interface of second region 7B with second tunnel layer 81B, and the impurity concentration decreases as its location in getting away from the interfaces in the thickness direction of silicon channel layer 7 in first region 7A and second region 7B. In addition, first region 7A and second region 7B are separated from each other by third region 7C. With such a configuration, no energy level at which spin is likely to attenuate will be generated in the region with a high concentration of impurity, and the spin can be transported to third region 7C and fourth region 7D both with a low impurity concentration. In addition, the thickness of first region 7A and second region 7B is 10 nm or less, which is much smaller than the spin diffusion length described in non-Patent Document 2. Thus, the effect on attenuation is limited when the spin passes through first region 7A and second region 7B. The impurity concentration is $1 \times 10^{19}$ cm$^{-3}$ or less in third region 7C and fourth region 7D. With such impurity concentrations, the semiconductor channel layer (silicon channel layer 7) does not show metallic behavior, and the spin in third region 7C and fourth region 7D is in a state of transporting easier than in first region 7A and second region 7B. Fourth region 7D shows a great resistance change when the semiconductor channel layer (silicon channel layer 7) is applied with gate voltage, and functions as a switch. Further, the spin transport distance that the spin can move until the attenuation of the spin is increased due to the drift effect, and the spin can be transported in long distance and the output can be increased.

The impurity refers to the element with an effect of adjusting the concentration of the carriers in the semiconductor channel layer (silicon channel layer 7). For example, when silicon channel layer 7 is of n type, the concentration of the carriers refers to the concentration of electrons. When silicon channel layer 7 is of p type, the concentration of the carriers refers to the concentration of positive holes. The concentration of the carriers can be measured by, for example, a device for determining Hall Effect, a device for measuring Seebeck coefficient, and the like. Further, as for the impurity concentration, the concentration distribution of the impurities in the depth direction (thickness direction) can also be measured through analysis using SIMS or the like.

First tunnel layer 81A and second tunnel layer 81B are insulating films for providing the magnetoresistance effect via the tunneling, effect. First tunnel layer 81A and second tunnel layer 81B are disposed on and contact with silicon channel layer 7. Insulating layer 8 has a function of preventing the spin from flowing out from silicon channel layer 7, and functions so that the spin polarized current flows through silicon channel layer 7 in the region between pinned layer 12A and free layer 12B.

The spin polarized current refers to the current due to the charges provided with spin freedom, and it is the current in which both the charge freedom and the spin freedom are kept.

FIG. 2 is a view showing the configuration of FIG. 1A when viewed in the Z direction, in which silicon channel layer 7 covered with insulating film 8 is in a state of existing on silicon oxide film 2 separately. The electrical connection with silicon channel layer 7 is possible through pinned layer 12A or free layer 12B.

Silicon channel layer 7 functions as a layer in which the spin is transported. Silicon channel layer 7 contains main part 7c of the silicon channel layer, first projection part 7a and second projection part 7b. Impurities are provided to silicon channel layer 7 to provide a uniform electrical conductivity, and the entire silicon channel layer 7 is of the same conductive type. For instance, when silicon channel layer 7 is of p type, the impurity can be B, Al, Ga, In and the like. For instance, when silicon channel layer 7 is of n type, the impurity can be P, As, Sb and the like.

In the present embodiment silicon channel layer 7 is shaped like a straight line. However, silicon channel layer 7 may also be shaped like a curved line or may be bent.

As the impurity is added to silicon channel layer 7 selectively, concentration difference of the impurity exists in silicon channel layer 7. In specific, the impurity concentration in the main part 7c of the silicon channel layer is lower than that in first projection part 7a and second projection part 7b of the silicon channel layer.

As shown in FIG. 1, in magnetoresistive element 100, first region 7A is contained in first projection part 7a, and second region 7B is contained in second projection part 7b. In addition, region 7C' which is a part of third region 7C is contained in first projection part 7a and second projection part 7b. Region 7C' is a region with a relatively high impurity concentration in third region 7C, so the impurity concentration in region 7C" is preferably monotonically decreasing in the thickness direction of silicon channel layer 7 from the interface between silicon channel layer 7 and first tunnel layer 81A or the interface between silicon channel layer 7 and second tunnel layer 81B. As such, since a region that the spin is likely to attenuate will not occur in region 7C', better spin transport property can be provided.

Main part 7c of the silicon channel layer contains fourth region 7D to which a gate voltage is applied, and it has a function that its specific resistance changes with the change of the applied gate voltage. In the present embodiment, a back gate typed configuration in which the gate voltage is applied to a region between silicon substrate 1 and main part 7c of silicon channel layer (fourth region 7D) through silicon oxide layer 2 is provided. Magnetoresistive element 100 has a configuration in which regions 7C' are separated by fourth region 7B, thus the spin polarized current flowing though main part 7c of the silicon channel layer between pinned layer 12A and free layer 12B flows through fourth region 7D whose specific resistance changes depending on the gate voltage. The spin polarized current flows through fourth region 7D and is thus regulated, and the spin output can be changed.

The method for applying the gate voltage to fourth region 7D is not limited to the mentioned one. It may also be a top gate typed configuration that the gate electrode is disposed between first projection part a and second projection part 7b of silicon channel layer 7. The gate electrode can also be arranged to surround the whole of main part 7c of the silicon channel layer which is disposed between first projection part 7a and second projection part 7b of silicon channel layer 7.

Hereinafter, the operation of magnetoresistive element 100 will be described. The current source is disposed in such a manner that the current, flows through silicon channel layer 7 between pinned layer 12A and free layer 12B as shown in FIG. 1 and FIG. 2. Similarly, the voltmeter is disposed between pinned layer 12A and free layer 12B. The current flows from pinned layer 12A made of ferromagnetic material to the non-magnetic silicon channel layer 7 through first tunnel layer 81A, and the current further flows to free layer 12B through second tunnel layer 81B. The electrons with the spin which corresponds to the magnetization orientation of free layer 12B are introduced into silicon channel layer 7. The introduced spin is transported towards the side of pinned layer 12A. In this way, magnetoresistive element 100 has such a configuration that the current flowing to silicon channel layer 7 and the pure spin current mainly flow in the Y direction. As such, the resistance of magnetoresistive element 100 changes in response to the magnetization orientation of free layer 12B (i.e., the spin of electrons) and the magnetization orientation of pinned layer 12A which change with the external magnetic field. Thus, the change in resistance can be detected by measuring the voltage between pinned layer 12A and free layer 12B.

Pinned layer 12A and free layer 12B are connected to the current source, and thus spin polarized current flows to the region between pinned layer 12A and free layer 12B through silicon channel layer 7. As the spin polarized current flows, the magnetoresistance effect induced by the relative angle between the magnetization direction of pinned layer 12A and that of free layer 12B can be detected.

In this respect, magnetoresistive element 100 is provided with silicon channel layer 7, pinned layer 12A disposed on silicon channel layer 7 via first tunnel layer 81A, and free layer 12B disposed on silicon channel layer 7 via second tunnel layer 81B. As such, silicon channel layer 7 substantially consists of first region 7A containing the interface with first tunnel layer 81A, second region 7B containing the interface with second tunnel layer 81B, and third region 7C, wherein the impurity concentration is higher than $1 \times 10\, \mathrm{cm}^{-3}$ in first region 7A and second region 7B, and the impurity concentration is $1 \times 10^{19}\, \mathrm{cm}^{-3}$ or less in the third region. First region 7A and second region 7B are separated by third region 7C. The impurity concentration in first region 7A is decreasing monotonically in the thickness direction of silicon channel layer 7 from the interface between silicon channel layer 7 and first tunnel layer 81A. In addition, the impurity concentration in second region 7B is decreasing monotonically in the thickness direction of silicon channel layer 7 from the interface between silicon channel layer 7 and second tunnel layer 81B.

That is, magnetoresistive element 100 in the present embodiment is provided with silicon channel layer 7, pinned layer 12A disposed on silicon channel layer 7 via first tunnel layer 81A, and free layer 12B disposed on silicon channel layer 7 via second tunnel layer 81B, wherein the part closest to the interface with first tunnel layer 81A and the part closest to the interface with second tunnel layer 81B of silicon channel layer 7 have the highest impurity concentration in the whole silicon channel layer 7.

As the part of first region 7A closest to the interface with first tunnel layer 81A and the part of second region 7B closest to the interface with second tunnel layer 81B have the highest concentration of the impurity in the whole silicon channel layer 7, the generation of the energy level at which the spin is likely to attenuate in the vicinity of the interface of silicon channel layer 7 with first tunnel layer 81A and the interface with second tunnel layer 81B can be suppressed. Thus, a high spin output and good spin transport property can be provided. In addition, it can be suppressed that the spin exists locally at the interface of silicon channel layer 7 with first tunnel layer 81A and the interface with second tunnel layer 81B, and a high spin output can be provided with good spin transport property. In addition, due to the existence of the first region and the second region with a high concentration of the impurity, a low resistance is provided at the interface (the resistance at the interface of silicon channel layer 7 with first tunnel layer 81A and with second tunnel layer 81B), and a low resistance of the entire element can be provided. Thus, a good magnetoresistance effect can be provided in magnetoresistive element 100.

In magnetoresistive element 100, the impurity concentration is $1 \times 10^{19}\, \mathrm{cm}^{-3}$ or less in third region 7C. If the impurity concentration is higher than this concentration, silicon channel layer 7 will show an electric conductivity as a metal, and the spin is likely to attenuate. When the impurity concentration is controlled to $1 \times 10^{19}\, \mathrm{cm}^{-3}$ or less in third region 7C, a good spin transport can be provided.

In addition, magnetoresistive element 100 is provided with fourth region 7D to which a gate voltage is applied. When the gate voltage is applied to fourth region 7D, the specific resistance will change in fourth region 7D of silicon channel layer 7. As for the pure spin current, the spin output ΔV is represented as follows.

$$\Delta V = \frac{P^2 \lambda_N}{\sigma A} I \exp\left(-\frac{d}{\lambda_N}\right) \quad \text{[Equation 1]}$$

P represents the spin polarization ratio at the interface of silicon channel layer 7 with pinned layer 12A and free layer 12B, $\lambda_N$ represents the spin diffusion distance, σ represents the conductivity of silicon channel layer 7. A represents the cross-sectional area of silicon channel layer 7, I represents the current, and d represents the distance between electrodes (the distance between pinned layer 12A and free layer 12B). In this equation, the value obtained by dividing the spin diffusion distance by the conductivity and the cross-sectional area is called spin resistance. It is known that the lower the conductivity is, the higher the spin output will be. When the gate voltage is applied to fourth region 7D and the conductivity in fourth region 7D is changed to a low level, a higher spin output can be provided. In addition, if the concentration of the electrons in silicon channel layer 7 becomes lower, the spin life constituting the spin diffusion distance also becomes longer. In this way, a higher output can be provided.

In magnetoresistive element 100, the thickness is 10 nm or less in first region 7A and second region 7B. First region 7A and second region 7B have an effect of reducing the resistance at the interface of silicon channel layer 7 with first tunnel layer 81A and second tunnel layer 81B. Thereby, a better magnetoresistance effect (a higher magnetoresistance ratio) can be provided by decreasing the resistance at the interface which is one of the main elements that constitute the resistance of the magnetoresistive element. In contrast, if the thickness is thicker than 10 nm in first region 7A and second region 7B, the spin attenuates greatly when the spin polarized current flow through first region 7A and second region 7B. In this respect, the spin transport property will deteriorate and the magnetoresistance effect will deteriorate.

In magnetoresistive element 100, first region 7A is contained in first projection part 7a, and second region 7B is contained in second projection part 7b. The impurity concentration is higher in first region 7A and second region 7B than in third region 7C. Thus, the resistance at the interface can be low in first region 7A and second region 7B, but the spin to be transported is likely to attenuate. In this respect the spin attenuation is decreased, when first region 7A and second region 7B is not only thin in thickness in the direction identical to that of the spin polarized current, but also narrow in width in the direction perpendicular to the direction in which the spin polarized current flows. In addition, if the pure spin current flows in the direction perpendicular to the direction in which the spin polarized current flows, the spin output will decrease. However, when first region 7A in silicon channel layer 7 is contained in first projection part 7a and second region 7B is contained in second projection part 7b, the flow of the pure spin current in the direction perpendicular to the direction in which the spin polarized current flows can be suppressed. Thus, the decrease of the spin output can be suppressed, and a high magnetoresistance ratio can be provided.

In silicon channel layer 7, the highest impurity concentration is preferably $2\times10^{19}$ to $2\times10^{20}$ cm$^{-3}$ in first region 7A and second region 7B. If the impurity concentration is $2\times10^{19}$ cm$^{-3}$ or more in silicon channel layer 7, silicon turns to the degenerate semiconductor and will show metallic behavior. Thus, the formation of Schottky barrier at the semiconductor interface, which is a characteristic of a semiconductor, can be suppressed, and the resistance at the interface of silicon channel layer 7 with first tunnel layer 81A and second tunnel layer 81B (or the resistance between silicon channel layer 7 and pinned layer 12A and free layer 12B) decreases. In addition, as the formation of Schottky barrier is suppressed at the semiconductor interface, the problem that the spin exists locally at the semiconductor interface and does not contribute to the spin transport will hardly occur. If the impurity concentration is higher than $2\times10^{20}$ cm$^{-3}$ in first region 7A and second region 7B of silicon channel layer 7, the spin is likely to attenuate and the spin transport property tends to deteriorate due to the high impurity concentration.

In silicon channel layer 7, the impurity concentration is preferably $3\times10^{18}$ cm$^{-3}$ or less in fourth region 7D. In fourth region 7D of silicon channel layer 7, the concentration of the carrier changes due to the electrical field from the gate electrode. Since the carrier is induced by the potential change based on the gate voltage, magneto-resistive element 100 has a function as the MOSFET. In fourth region 7D of silicon channel layer 7 where the spin is transported, the resistance changes with the gate effect, which contributes to the spin transport. Fourth region 7D to which a gate voltage is applied is desired to have a high ON/OFF ratio based on the gate voltage. If the impurity concentration is $3\times10^{18}$ cm$^{-3}$ or less in fourth region 7D of silicon channel layer 7, the ON/OFF ratio based on the gate voltage will become higher. In addition, if the impurity concentration is $3\times10^{18}$ cm$^{-3}$ or less in fourth region 7D, fourth region 7D will function as a non-degenerate semiconductor, and the electrical conduction will diffuse and drift. In this way, the spin can be well transported along with the charges. Also, when the concentration of electrons decreases due to the gate effect, the spin will hardly attenuate and the spin can be further well transported.

In silicon channel layer 7, it is preferable that the impurity concentrations of third region 7C and fourth region 7D decrease with the distance away from first region 7A and second region 7B, alternatively, the impurity concentrations do not increase even with the distance away from first region 7A and second region 7B. If silicon channel layer 7 has a configuration that the impurity concentration has a peak value in third region 7C and fourth region 7D, a region will be formed in the part of the peak value in which the spin is likely to attenuate, which is disadvantageous to the spin transport property, although the influence is smaller compared to that of first region 7A and second region 7B with a high concentration of the impurity. The higher the impurity concentration is, the easier the spin will be scattered and attenuates. Thus, in order to suppress the spin attenuation caused by the scattering, it is preferable that the impurity concentration is low in silicon channel layer 7. When the impurity concentrations of third region 7C and fourth region 7D decrease with the distance away from first region 7A and second region 7B, the spin will reach the region with a sufficiently low concentration of the impurity, and it will be more susceptible to the gate voltage effect. Thereby, the spin output can be further increased. Further, it is also possible to output after adjusting the spin output with the gate voltage effect.

The areal resistance between pinned layer 12A and first region 7A and the areal resistance between free layer 12B and second region 7B are preferably lower than $1 \times 10^6$ $\Omega \cdot \mu m^2$. If each areal resistance is systematically changed, the magnetoresistance ratio will be the highest with an areal resistance of approximately $1 \times 10^4$ $\Omega \cdot \mu m^2$, and the magnetoresistance ratio will dramatically decrease with an a real resistance of $1 \times 10^6$ $\Omega \cdot \mu m^2$ or more. Since the resistance value constitutes the background in the magnetoresistive element, the resistance is preferably lower so as to decrease the background. However, if the thickness of the tunnel layer is increased, the spin output will increase due to the increased spin polarization ratio.

Magnetoresistive element 100 is applicable to Spin-MOSFETs, magnetic heads, spin transistors, memories, sensors, logical circuits or the like. Preferably, it is a Spin-MOSFET, The Spin-MOSFET refers to a device in which the ferromagnetic material is used in the source electrode and the drain electrode of the MOSFET, and the element resistance changes as the relative angle formed by the magnetization orientation of the ferromagnetic material for the source electrode and that of the ferromagnetic material for the drain electrode changes. The most outstanding characteristic of the Spin-MOSFET is the nonvolatile information storage corresponding to the magnetization states of the source electrode and the drain electrode and the output property that regeneration is possible. Especially, a new architecture can be provided in which static power can be reduced to a large extent, wherein the static power is one of the important problems in the CMOS integrated circuit.

Figure 16:
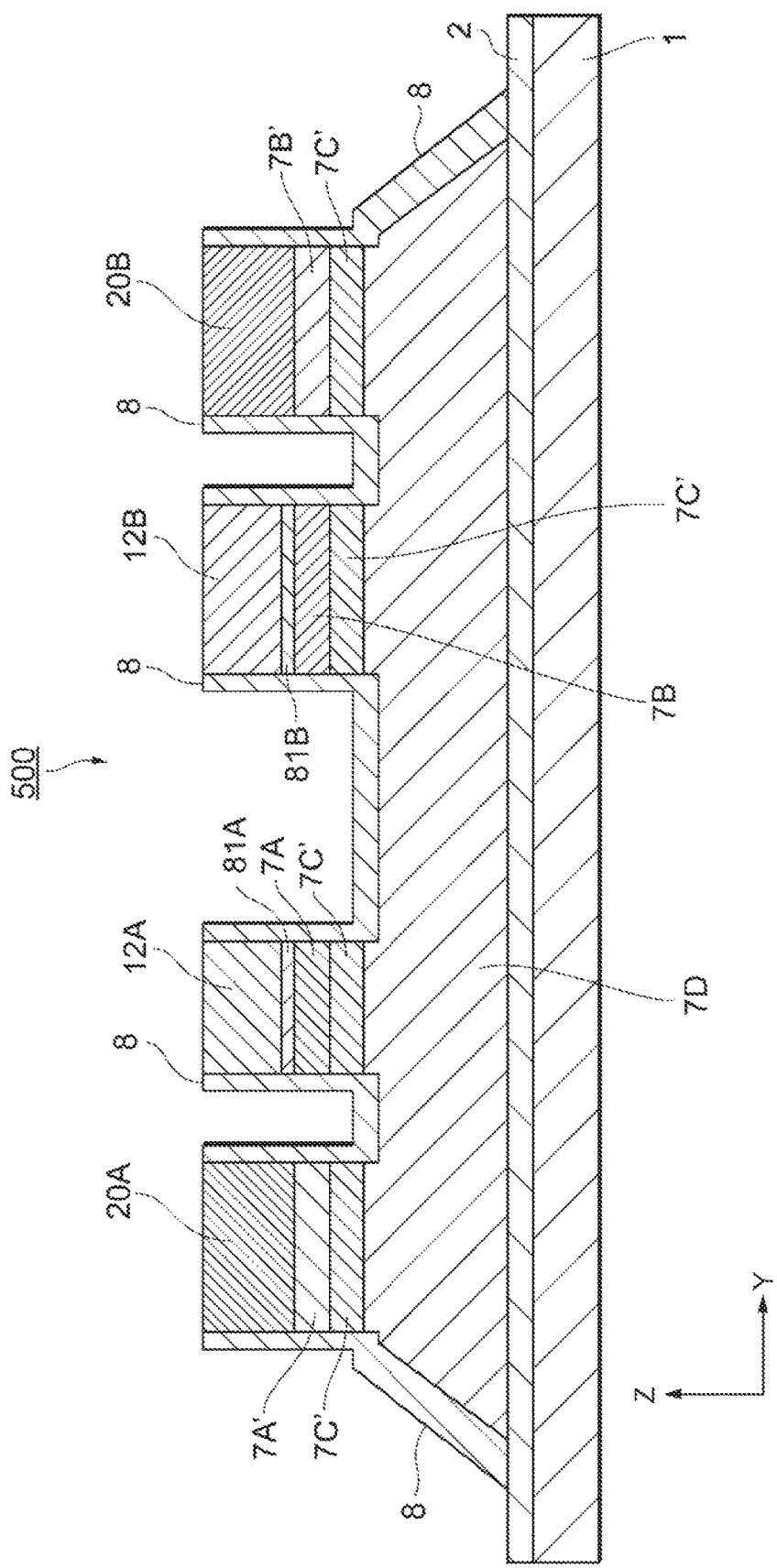
FIG. 16 is a cross-sectional view showing the magnetoresistive element in Example 5.

New functions can be added by arranging new electrodes in magnetoresistive element 100. In spin-transport element 500 as Shown in FIG. 16, first reference electrode 20A made of nonmagnetic material and second reference electrode 20B made of nonmagnetic material are disposed on the outer sides of pinned layer 12A and free layer 12B of magnetoresistive element 100. Magnetoresistive element 100 can also be used as a spin-transport element using the pure spin current. It is possible to function as a spin-transport element using the pure spin current by, for example, the steps of arranging current source to connect pinned layer 12A with fast reference electrode 20A, so that the current flows between pinned layer 12A and first reference electrode 20A is silicon channel layer 7, and arranging a voltmeter to measure the voltage between pinned layer 12A and the second reference electrode. In spin-transport element 500 as shown in FIG. 16, region 7A' and region 7B' are regions with the same impurity concentrations as those in first region 7A and second region 7B. However, the impurity concentrations in region 7A', region 7B' and region 7C" which are right under first reference electrode 20A and second reference electrode 20B are not particularly restricted.

Figure 3:
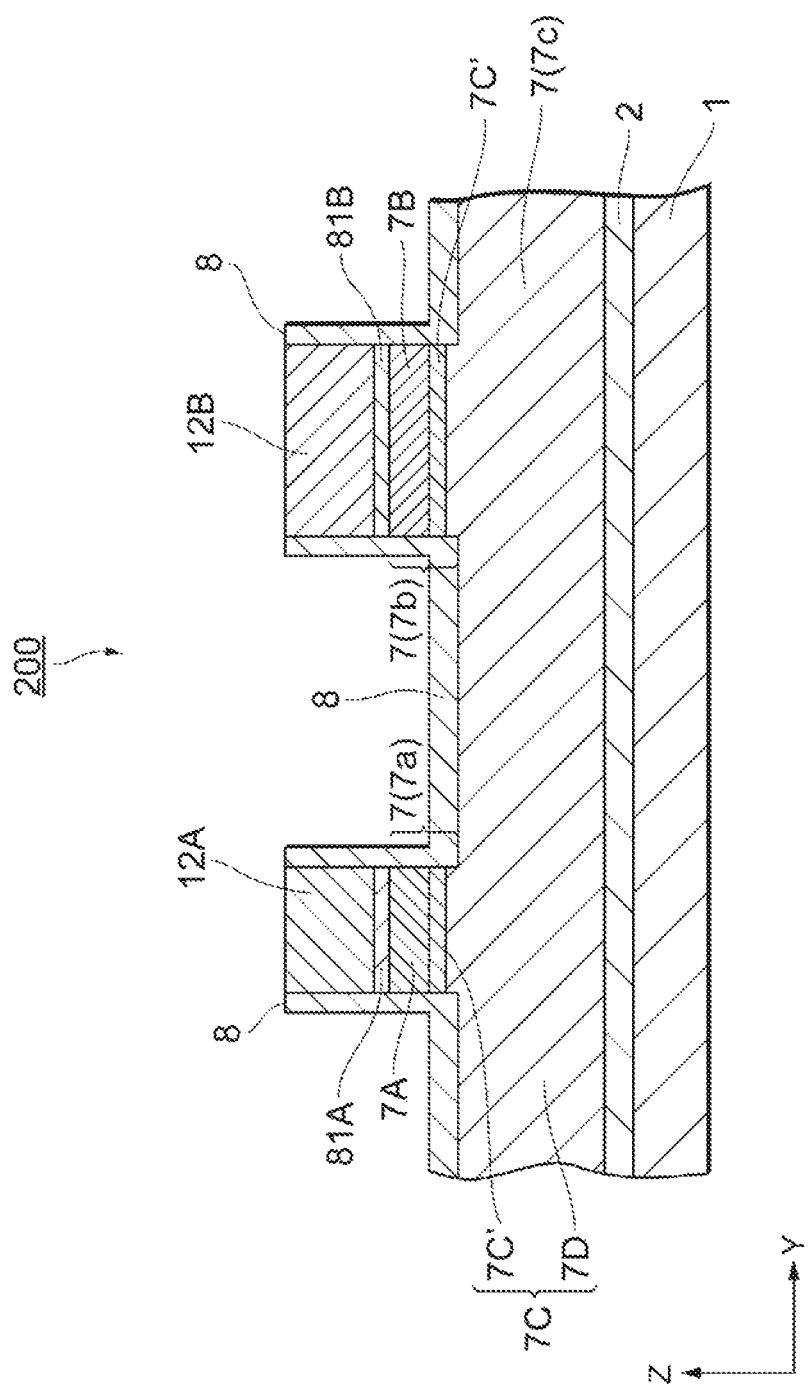
FIG. 3 is a cross-sectional view showing a configuration where no side wall exists in the vicinity of the path through which the spin polarized current flows in the silicon channel layer.

Hereinbefore, maim element 100 according to the first embodiment has been described. However, the present invention is not limited to it. For example, magnetoresistive element 100 may also be made as the following configuration. The electrode can be arranged on insulating, layer 8 on silicon channel layer 7 and the gate voltage is applied from the upper side of silicon channel layer 7. In addition, magnetoresistive element 200 as shown in FIG. 3 can also function even no side walls exist in the vicinity of the path in silicon channel layer 7 in which the spin polarized current flows. However, in that case, due to the pine spin current without the charges generated in silicon channel his 7 from the spin polarized current, the output property deteriorates compared to that of magnetoresistive element 100 with the configuration as shown in FIG. 1 and FIG. 2. That is, in magnetoresistive element 100, the pore spin current generated by the spin polarized current introduced into silicon channel layer 7 can be transported in the direction opposite to that in which the spin polarized current flows. However, even if it flows, the pure spin current will not flow out in excess because there are side walls. In magnetoresistive element 200, as no side wall exists in the vicinity, the pure spin current generated flows over a long distance until it reaches the side wall of silicon channel layer 7. The flowing of the pure spin current causes the deterioration of the output property.

The electric filed can be applied to silicon channel layer 7 as the current flows to silicon substrate 1. Thus, the direction of the spin polarization in the spin polarized current can be adjusted. In addition, the silicon oxide film has been shown as an example of insulating, layer 8. However, insulating layer 8 may be made of any insulating material. For example, silicon nitride film or the like are included as insulating layer 8.

The coercivity difference is not provided to pinned layer 12A and free layer 12B by the shape anisotropy. For example, the anti-ferromagnetic layer may be further disposed on pinned layer 12A. The anti-ferromagnetic layer functions to fix the magnetization orientation of pinned layer 12A. When the anti-ferromagnetic layer is coupled to the pinned layer, the pinned layer can be provided with unidirectional anisotropy in the magnetization direction of the pinned layer. In this case, a pinned layer with a higher coercivity in a single direction than the case in which no anti-ferromagnetic layer is disposed can be provided. The material for the anti-ferromagnetic layer is selected depending on the material for the pinned layer. For instance, the anti-ferromagnetic alloy using Mn is used as the material for the anti-ferromagnetic layer. In particular, the alloy can be one containing Mn and at least one element selected from the group consisting of Pt, Ir, Fe, Ru, Cr, Pd and Ni. More specifically, for example, IrMn and PrMn are included.

The magnetoresistive element element using silicon as the semiconductor material has been described. However, the present invention can also be provided even when using gallium arsenide (GaAs) as the semiconductor material. In this case, GaAs substrate ma be used instead of silicon substrate 1, GaAs oxide film may be used instead of silicon oxide film 2, and GaAs channel layer may be used instead of silicon channel layer 7. Further, the semiconductor material may also be the compound of silicon and germanium.

Hereinafter, the present invention will be further described in detail based on Examples 1 to 5. However, the present invention is not intended to be limited to the following Examples 1 to 5.

Example 1

As the magnetoresistive element of Example 1, magnetoresistive element 100 of the first embodiment was manufactured as follows, A SOI substrate composed of silicon substrate 1, silicon oxide layer 2 (200 nm in thickness) and silicon channel layer 7 (100 nm in thickness) was prepared. The alignment marker was manufactured in the SOI substrate by photolithography.

First of all, the fast ion injection was performed. The first ion injection was performed to provide the impurity concentration in fourth region 7D of the silicon channel layer as shown in FIG. 1. In particular, in order to provide the whole silicon channel layer 7 with the n type conductivity, the impurity ion injection was performed from the whole top face of silicon channel layer 7 with a high energy. Phosphorus was used as the impurity. After that, the impurity was diffused by annealing, and the concentration of electrons in the silicon film was adjusted. The annealing lasted for 1 hour at a temperature of 900° C. The average impurity concentration became $1\times10^{18}$ cm$^{-3}$ in the entire silicon channel layer 7.

Then, the second ion injection was performed. The second ion injection was performed to provide the impurity concentration in first region 7A, second region 7B and region 7C' of the silicon channel layer as shown in FIG. 1. In particular, in order to provide the n type conductivity, the impurity ion was injected from the whole top face of silicon channel layer 7. Phosphorus was used as the impurity. The energy for ion acceleration used in the second ion injection was selected to be weaker than that in the first ion injection. In the second ion injection, the maximal impurity concentration became $2\times16^{20}$ cm$^{-3}$, Further, the annealing lasted for 1 minute at the temperature of 900° C.

Thereafter, the attached matters, organic substances and the oxide film on the surface of silicon channel layer 7 were removed by the washing process. HF was used as the cleansing liquid.

Then, silicon channel layer 7 was etched in such a manner that the impurity concentration became the highest on the outmost surface of silicon channel layer 7. The etching was performed by ion milling. In order to decrease the damage to silicon channel layer 7, the ion milling was performed by adjusting the incidence angle of the ion beam. The ion beam entered in a direction almost parallel to silicon channel layer 7, and the silicon was etched slowly with the component of the ion beam within the divergence angle. With this method, 5 nm of silicon channel layer 7 on the outmost surface was milled. Then, the treated substrate was kept still in the atmosphere for 24 hours or longer to oxidize the surface of the silicon naturally.

The method for etching silicon channel layer 7 so that the impurity concentration on the outmost surface of silicon channel layer 7 became the maximal was not limited to the mentioned one. For example, there was another method in which chemical solution was used to perform the oxidation and to remove the oxide film and silicon channel layer 7 was etched. In addition, the method using chemical mechanical planarization (CMP) can also be employed.

Figure 4:
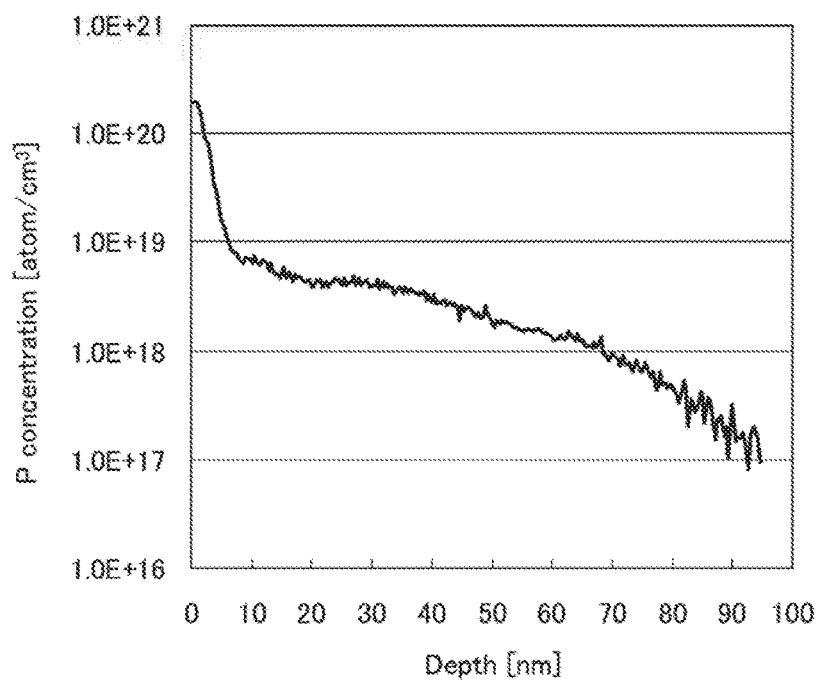
FIG. 4 is a graph showing the measurement result of SIMS in Example 1.

After the oxide film naturally formed on the surface of silicon channel layer 7 was removed by using HF, the concentration distribution of phosphorus as the impurity in the depth direction from the outmost surface of silicon channel layer 7 was evaluated by SIMS (secondary ion mass spectrometry) to investigate the concentration distribution of the impurity in silicon channel layer 7. The outmost surface of silicon channel layer 7 referred to the most distant surface of silicon channel layer 7 away from silicon substrate 1. In magnetoresistive element 100 as shown in FIG. 1, the outmost surface corresponded to first projection part 7a and second projection part 7b. The results from SIMS in Example 1 were shown in FIG. 4. The impurity concentration was the highest on the outmost surface of silicon channel layer 7 and the impurity concentration was $2\times10^{20}$ cm$^{-3}$. In addition, the impurity concentration in silicon channel layer 7 decreased dramatically from the outmost surface to the depth range of approximately 10 nm below the outmost surface. Then, the impurity concentration slowly decreased when the depth reached 10 nm or more. Further, when the depth reached 40 nm or more, the impurity concentration was $3\times10$ cm$^{-3}$ or less.

The magnesium oxide film (1.4 nm in thickness) which became first tunnel layer 81A and second tunnel layer 81B was formed on silicon channel layer 7 by ultra-high vacuum electron beam evaporation, after the oxide film naturally formed on the surface of silicon channel layer 7 was removed by using HF. Then, the iron film (10 nm in thickness), titanium film and tantalum film were formed on the magnetism oxide film in said order by the MBE method. The titanium film and the tantalum film were the gap layers to prevent the characteristic deterioration due to the oxidation of the iron film which turned to pinned layer 12A and free layer 12B later. Since the titanium film and the tantalum film were amorphous, they had little influence the crystallization of the iron film.

The patterning was performed in a way that both parts which turned into pinned layer 12A and free layer 12B later were contained and resist remained in a rectangular shape with its long axis in the Y direction. The resist at this stage was 23 μm×300 μm in size. After the oxide film of silicon naturally formed was milled by ion milling until silicon channel layer 7 was exposed, the part other than silicon channel layer 7 under the resist was removed by a method of anisotropic etching of silicon. However, the alignment marker was treated in advance in such a manner that the alignment marker was remained. The (111) face was exposed by the anisotropic etching on the side surfaces of silicon channel layer 7, and the side surfaces of silicon channel layer 7 inclined with an angle of approximately 55 degrees relative to the Z direction as shown in FIG. 1. Further, the thus obtained side surface of silicon channel layer 7 was oxidized to form insulating layer 8 composed of the silicon oxide film.

The patterning of the resist was performed on part of pinned layer 12A and free layer 12B by. Then, the parts exposed from the resist which were silicon channel layer 7, the magnesium oxide film, the iron film, the titanium film and the tantalum film were milled by the ion milling, Farther, 45 nm of silicon channel layer 7 was milled from the interface between silicon channel layer 7 and the magnesium oxide film. In order to provide a difference in magnetic anisotropy, the size of pinned layer 12A was set to 21 μm×0.3 μm size of free, layer 12B was set to 2:1 μm×2 μm. Then, silicon oxide which functioned as insulating layer 8 was formed on pinned layer 12A, free layer 12B, first tunnel layer 81A, second tunnel layer 81B, exposed side walls 7e of silicon channel layer 7 and the top surface of silicon channel layer 7, Such a state was shown in FIG. 1 and FIG. 2.

Figure 5:
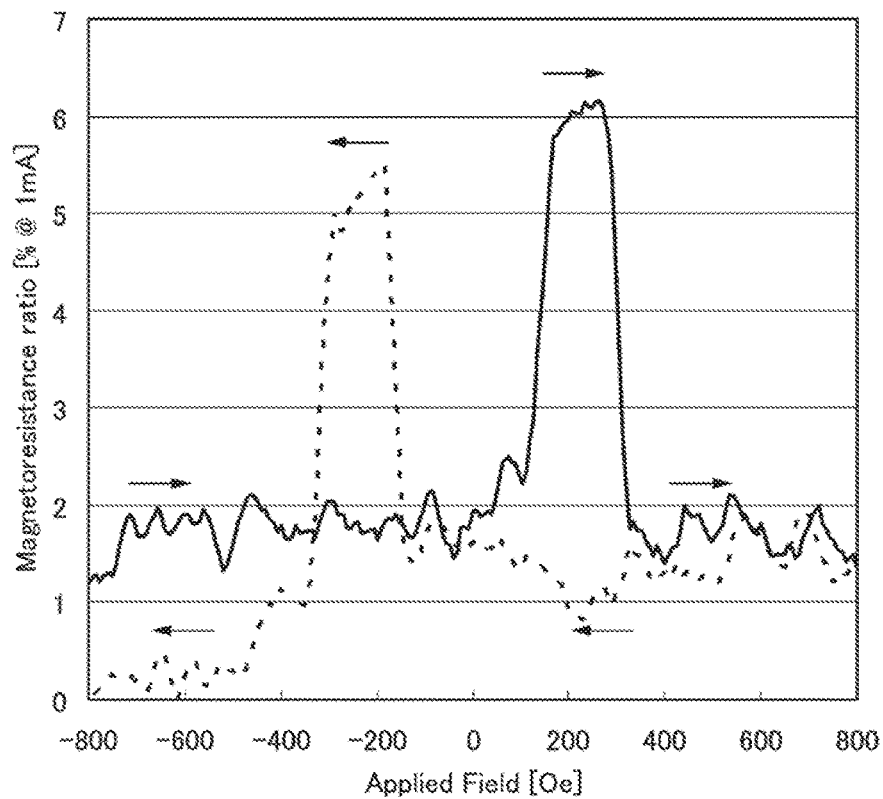
FIG. 5 is a graph showing the measurement result of the magnetoresistive element in Example 1.

The measurement results of the magnetoresistive element in Example 1 were shown in FIG. 5. The current source and the voltmeter were disposed to connect free layer 12B and pinned layer 12A, respectively, and the measurement was performed while scanning the magnetic field in the axis direction in which the magnetization is easy in free layer 12B and pinned layer 12A. In addition, in the magnetoresistive element in Example 1, the long axes of free layer 12B and pinned layer 12A were in the X direction, and the magnetic field was scanned in this direction. The arrows shown in FIG. 5 represented the case in which the magnetic field was scanned in the plus direction and the case in which the magnetic field was scanned in the minus direction. The applied current was a constant current of 1 mA, and the voltage change was measured. Further, the minimal resistance value and the maximal resistance value determined based on the current-voltage relationship were used to determine the magnetoresistance ratio. FIG. 5 was a graph in which the magnetoresistance ratio was shown in vertical axis and the magnetic field was shown in horizontal axis. And the magnetoresistance ratio calculated by using the minimal resistance value as the reference was shown in the vertical axis in FIG. 5. In Example 1, according to the difference between the top and the bottom of the peak in the tetragonum as shown in FIG. 5, a magnetoresistance ratio of 4.6% was provided.

Figure 6:
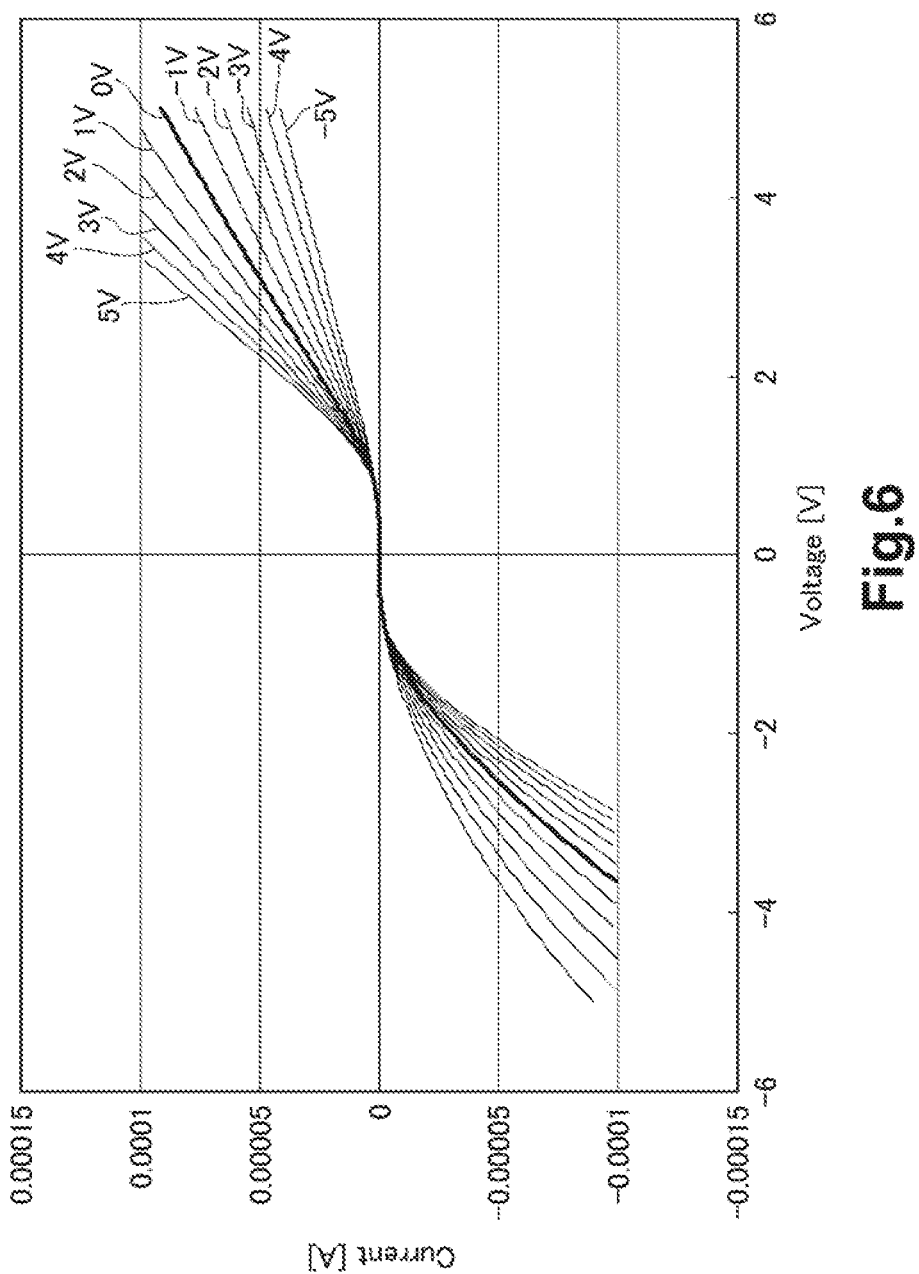
FIG. 6 is a graph showing the measurement result of the gate effect in Example 1.

The measurement result on the gate effect in the magnetoresistive element of Example 1 was shown in FIG. 6. The measurement was performed by arranging the current source and the voltmeter to connect free layer 12B and pinned layer 12A, respectively. In addition, the current source was arranged in such a manner that the gate voltage was applied to the part between silicon substrate 1 and fourth region 7D of silicon channel layer 7 through silicon oxide layer 2, as shown in FIG. 1 and silicon substrate 1 functioned as the back gate electrode. The current-voltage relationship between free layer 12B and pinned layer 12A was measured while applying the gate voltage. The thick solid line in FIG. 6 represented the result when the gate voltage was zero. According to FIG. 6, it could be seen that the current-voltage relationship between free layer 12B and pinned layer 12A changed depending on the gate voltage in the magnetoresistive element of Example 1.

Figure 7:
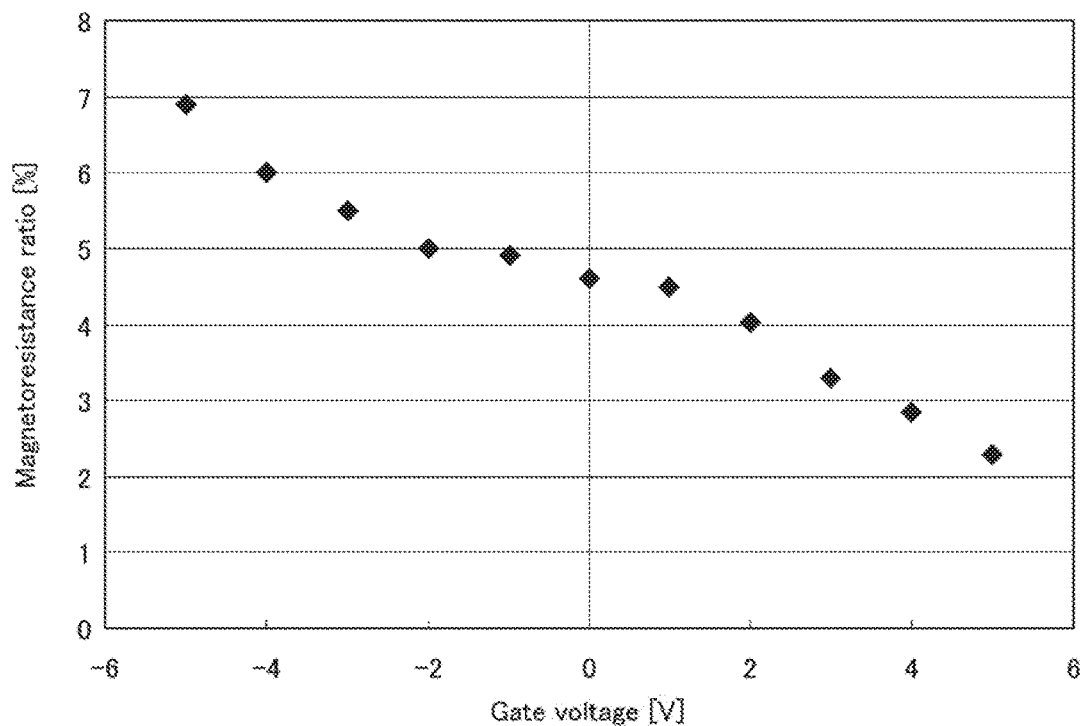
FIG. 7 is a graph showing the dependence of the magnetoresistance ratio on the gate voltage in Example 1.

The dependence of the magnetoresistance ratio on the gate voltage in the magnetoresistive element of Example 1 was shown in FIG. 7. The measurement method was the same as the one by which the result in FIG. 6 was provided. However, the evaluation was performed when the applied current was set to 1 mA and the magnetic field was scanned in the X direction. Similar to the data processing in FIG. 5, the magnetoresistance ratio was calculated from the obtained results. And the magnetoresistance ratio was plotted with respect to the gate voltage in FIG. 7. The magnetoresistance ratio changed depending on the gate voltage. If the gate voltage was applied and the specific resistance of silicon channel layer 7 decreased, the magnetoresistance ratio decreased. If the specific resistance of silicon channel layer 7 increased, the magnetoresistance ratio increased. All these suggested that the Spin-MOSFET was working.

Example 2

The magnetoresistive element was manufactured in Example 2 by a similar method described in Example 1 except for the following conditions. Compared to Example 1, only the second ion injection was performed without the first ion injection. First region 7A and second region 7B were controlled to have a maximal impurity concentration of $5 \times 10^{20}$ cm$^{-3}$. Nine different magnetoresistive elements were manufactured at an annealing temperature of 900° C. with holding times ranging from 1 to 120 minutes. Similar to Example 1, the outmost surface of silicon channel layer 7 was subjected to etching, and 5 nm of silicon channel layer 7 was milled on its outmost surface.

Figure 8:
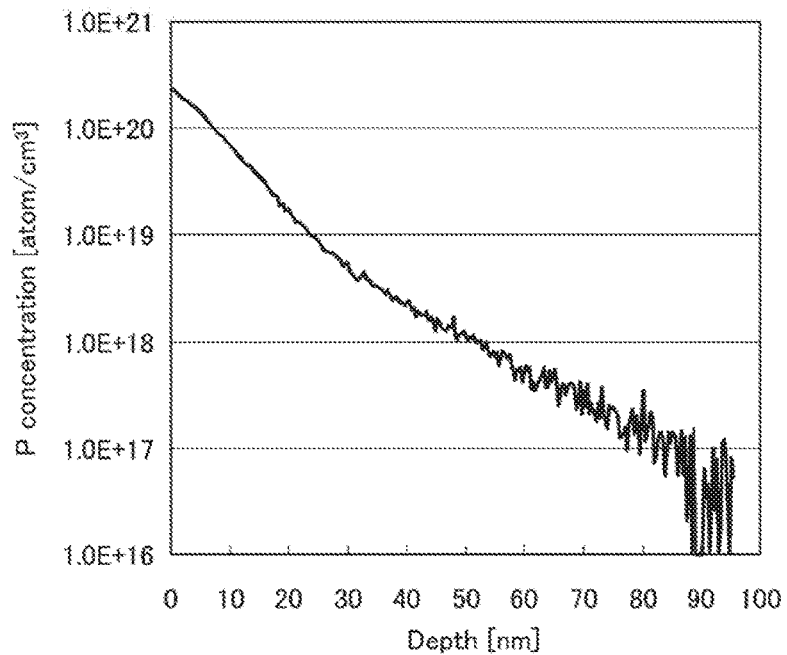
FIG. 8 is a graph showing the measurement result of SIMS with an annealing holding time of 60 minutes in Example 2.

In order to investigate the concentration distribution of the impurities in silicon channel layer 7, the concentration distribution of phosphorus as the impurity was evaluated by SIMS along the depth direction starting from the outmost surface of silicon channel layer 7. The SIMS result with a holding time in annealing of 60 minutes was shown in FIG. 8. The impurity concentration was the highest on the outmost surface of silicon channel layer 7, which was $2 \times 10^{20}$ cm$^{-3}$. The impurity concentration was $6.9 \times 10^{19}$ cm$^{-3}$ at the part with a depth of 10 nm, and the impurity concentration was lower than $1 \times 10^{19}$ when the depth was 24 nm or more.

Figure 9:
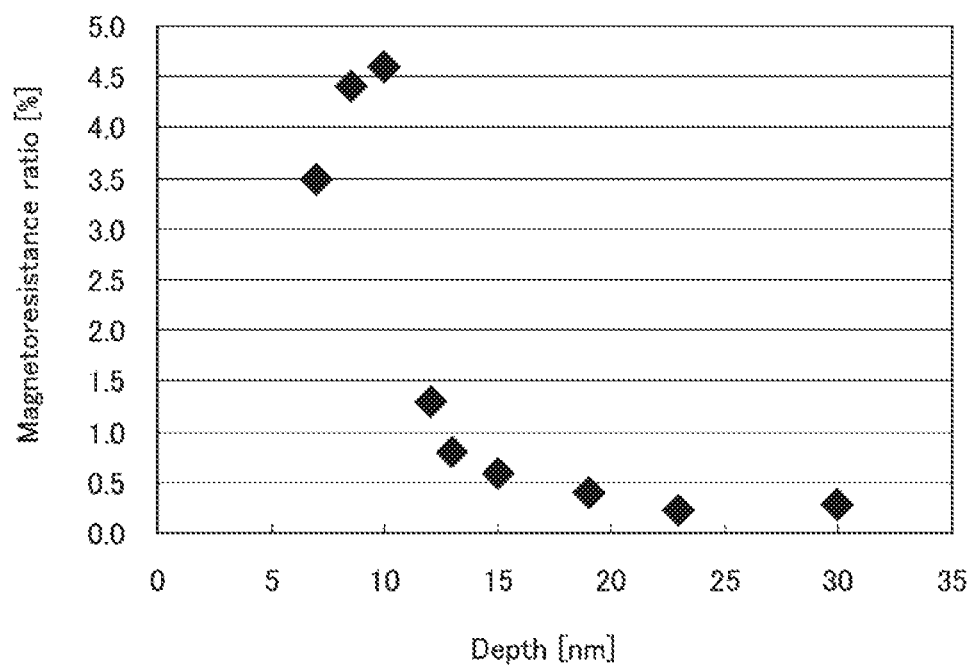
FIG. 9 is a graph showing the relationship between the depth of the silicon channel layer where the impurity concentration reaches $1 \times 10^{19}$ cm$^{-3}$ and the magnetoresistance ratio in Example 2.

Similarly, the magnetoresistive elements treated with various annealing times were evaluated by SIMS, and the depth from the outmost surface of silicon channel layer 7 with an impurity concentration of $1 \times 10^{19}$ cm$^{-3}$ was measured. In addition, the magnetoresistance ratio was evaluated as described in Example 1. FIG. 9 was a graph showing the relationship between the depth where the impurity concentration was $1 \times 10^{19}$ cm$^{-3}$ and the magnetoresistance ratio.

It could be known that the depth where the impurity concentration was $1 \times 10^{19}$ cm$^{-3}$ was 10 nm or less, where the magnetoresistance ratio increased dramatically. Thus, such conditions were the most suitable.

Example 3

Figure 10:
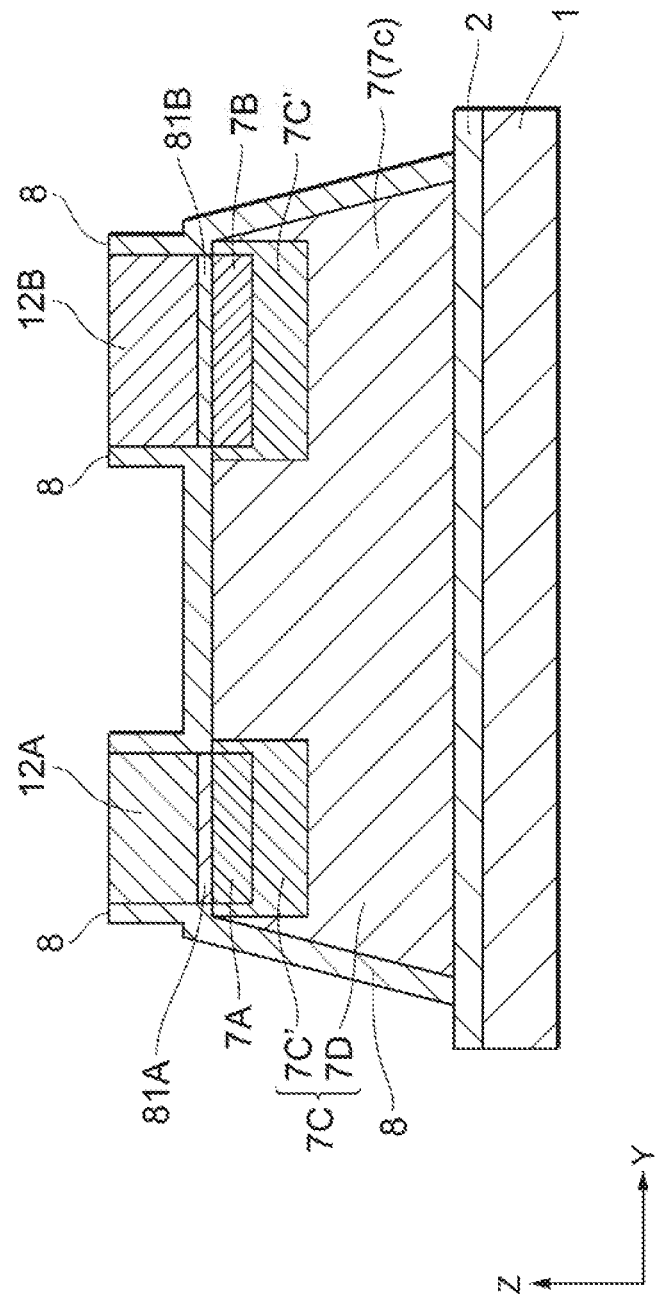
FIG. 10 is a cross-sectional view showing the magnetoresistive element in Example 3.

FIG. 10 showed the element configuration of the magnetoresistive element of Example 3. The magnetoresistive element was manufactured in Example 3 by the same method described in Example 1 except for the following conditions. Compared to Example 1, when the second ion injection was performed, the impurity ion was selectively injected from the top surface of silicon channel layer 7 only in the regions where pinned layer 12A and free layer 12B were formed. In addition, after the resist was patterned on part of pinned layer 12A and free layer 12B, the parts of the magnesium oxide film, the iron film, the titanium film and the tantalum film exposed from the resist were milled by the ion milling. That was, different from Example 1, silicon channel layer 7 was not milled, and the ion milling was stopped after the magnesium oxide film was milled.

The magnetoresistance ratio was evaluated, as described in Example 1, and the result showed a magnetoresistance ratio of 3.4%.

Comparison Between Example 1 and Example 3

The difference between Example 1 and Example 3 was whether first region 7A and second region 7B of silicon channel layer 7 were contained in the projection parts. Compared to Example 1, the magnetoresistance ratio had some decrease in Example 3 in which first region 7A and second region 7B were not contained in the projection parts. Thus, it could be seen that it was effective to contain first region 7A and second region 7B in the projection parts. The reason for this could be considered that when first region 7A and second region 7B were disposed in the projection parts of silicon channel layer 7, an effect was provided that the spin diffusion along the direction perpendicular to that in which the spin current was transported could be suppressed.

Example 4

The magnetoresistive element was manufactured in Example 4 by the same method described in Example 1 except for the following conditions. Compared to Example 1, nine magnetoresistive elements with maximal impurity concentrations of $8 \times 10^{18}$, $1 \times 10^{19}$, $2 \times 10^{19}$, $4 \times 10^{19}$, $5 \times 10^{19}$, $8 \times 10^{19}$, $2 \times 10^{20}$, $3 \times 10^{20}$ and $5 \times 10^{20}$ cm$^{-3}$ in first region 7A and second region 7B were manufactured by injecting different amounts of impurity during the second ion injection. The annealing process was performed at the temperature of 900° C. for a holding time of 1 minute.

Figure 11:
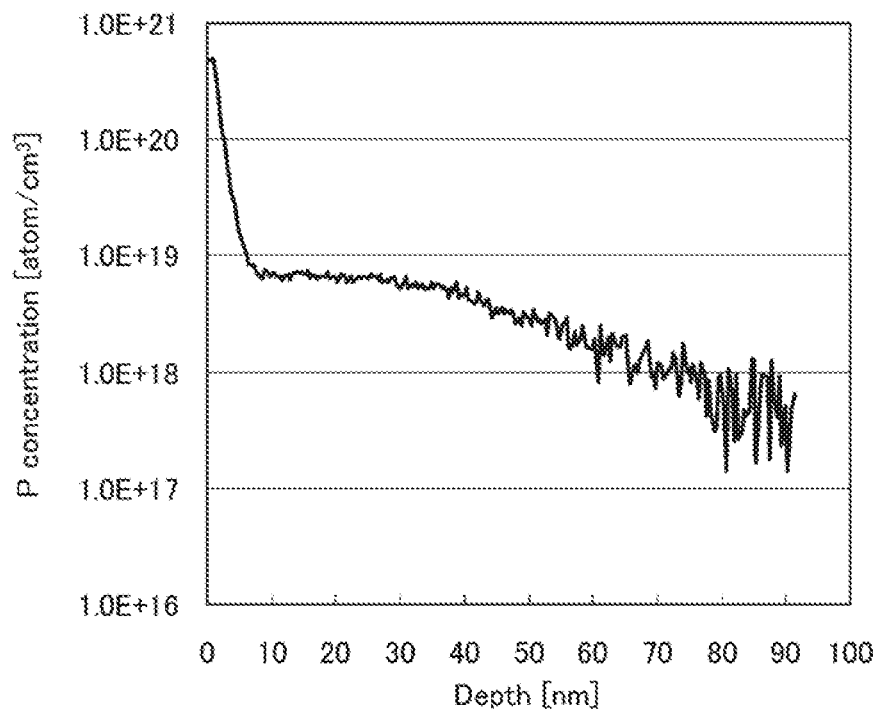
FIG. 11 is a graph showing the measurement result of SIMS with a maximal concentration of the impurity in the silicon channel layer of $5 \times 10^{20}$ cm$^{-3}$ in Example 4.

In order to investigate the concentration distribution of the impurity in silicon channel layer 7, the concentration distribution of phosphorus as the impurity was evaluated by SIMS along the depth direction starting from the outmost surface of silicon channel layer 7. The measurement result of SIMS in the case that the maximal impurity concentration was $5 \times 10^{20}$ cm$^{-3}$ in first region 7A and second region 7B was shown in FIG. 11. The distribution of the impurity was the same as that in Example 1, However, a maximal impurity concentration of $5 \times 10^{20}$ cm$^{-3}$ existed on the outmost surface of silicon channel layer 7.

Figure 12:
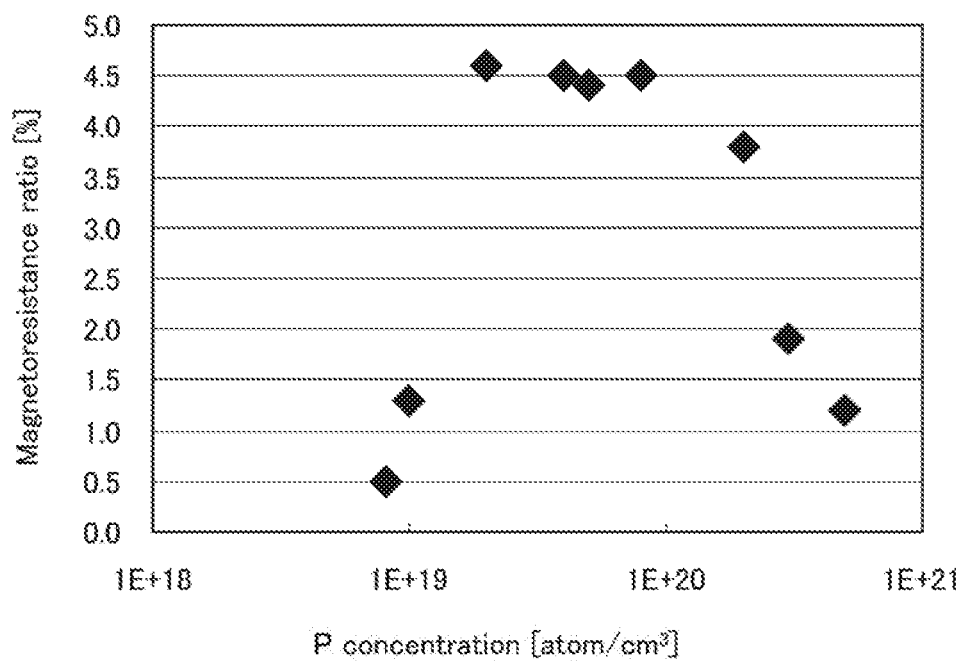
FIG. 12 is a graph showing the relationship between the impurity concentration on the outmost surface of the silicon layer and the magnetoresistance ratio in Example 4.

Similarly, each magnetoresistive element to which the impurity with said impurity concentration had been injected was evaluated by SIMS. In addition, the magnetoresistance ratio was evaluated as described in Example 1. FIG. 12 was a graph showing the relationship between the magnetoresistance ratio and the impurity concentration on the outmost surface of silicon channel layer 7 which was the maximal impurity concentration in first region 7A and second region 7B in the magnetoresistive element of Example 4.

The magnetoresistance ratio was high when the maximal impurity concentration ranged from $2 \times 10^{19}$ cm$^{-3}$ in first region 7A and second legion 7B, which indicated that the optimum concentration of the electrons corresponding to the maximal impurity concentration in first region 7A and second region 7B fell within this range.

Comparative Example 1

The magnetoresistive element was manufactured in Comparative Example 1 by the same method described in Example 1 except for the following conditions. Compared to Example 1, a new step for ion injection was arranged between the steps of the first ion injection and the second ion injection. In this new step for ion injection, the impurity was introduced from the whole top surface of silicon channel layer 7 so that the maximal impurity concentration was $1 \times 10^{19}$ cm$^{-3}$, and the energy for the on injection was at a level between that used in the first ion injection step and that used in the second ion injection step. The annealing step was performed at a temperature of 900° C. for a holding time of 5 minutes.

Figure 13:
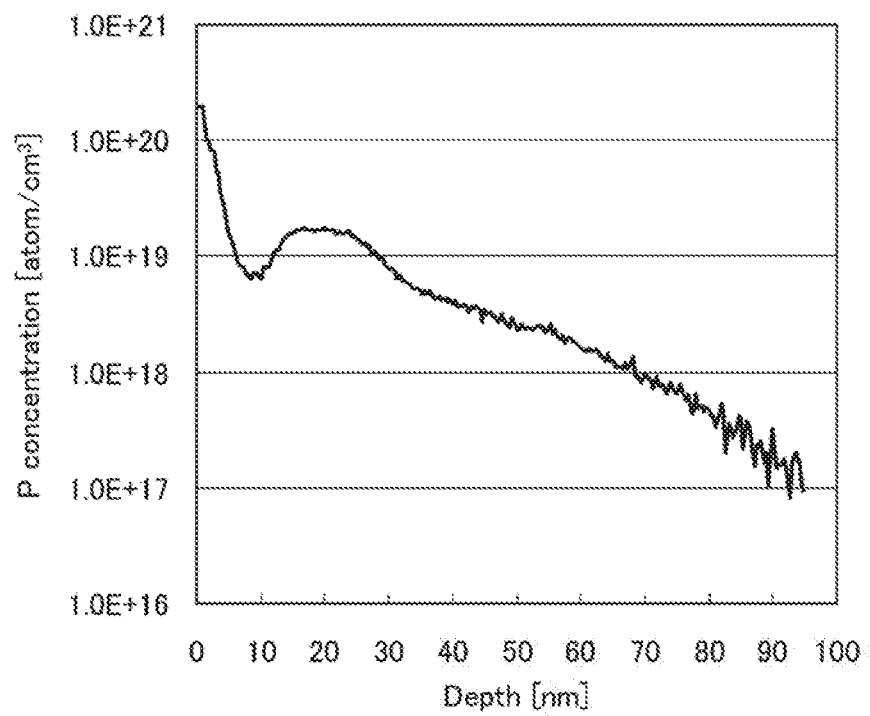
FIG. 13 is a graph showing the measurement result of SIMS in Comparative Example 1.

In order to investigate the concentration distribution of the impurity in silicon channel layer 7, the concentration distribution of phosphorus as the impurity was evaluated by SIMS along the depth direction starting from the outmost surface of silicon channel layer 7. The measurement result of SIMS in Comparative Example 1 was shown in FIG. 13. The impurity distribution was similar to that in Example 1. However, due to the new added step of ion injection, a part with a high impurity including a new peak in the vicinity of the part with a depth of 20 nm was formed. The impurity concentration was $1.6 \times 10^{19}$ cm$^{-3}$ at the new peak. And the impurity concentration at the part with a depth of 10 nm was $6 \times 10^{18}$ cm$^{-3}$.

The element was evaluated by using the same method as used in Example 1. The magnetoresistance ratio obtained from the measurement of magnetoresistance was 0.1%.

Comparative Example 2

The magnetoresistive element was manufactured in Comparative Example 2 by the same method described in Example 1 except for the following conditions. Compared to Example 1, the step of milling the outmost surface of silicon channel layer 7 was not performed. In addition, HF was used to remove the oxide film naturally formed on the outmost surface of silicon channel layer 7 before the magnesium oxide film was formed.

Figure 14:
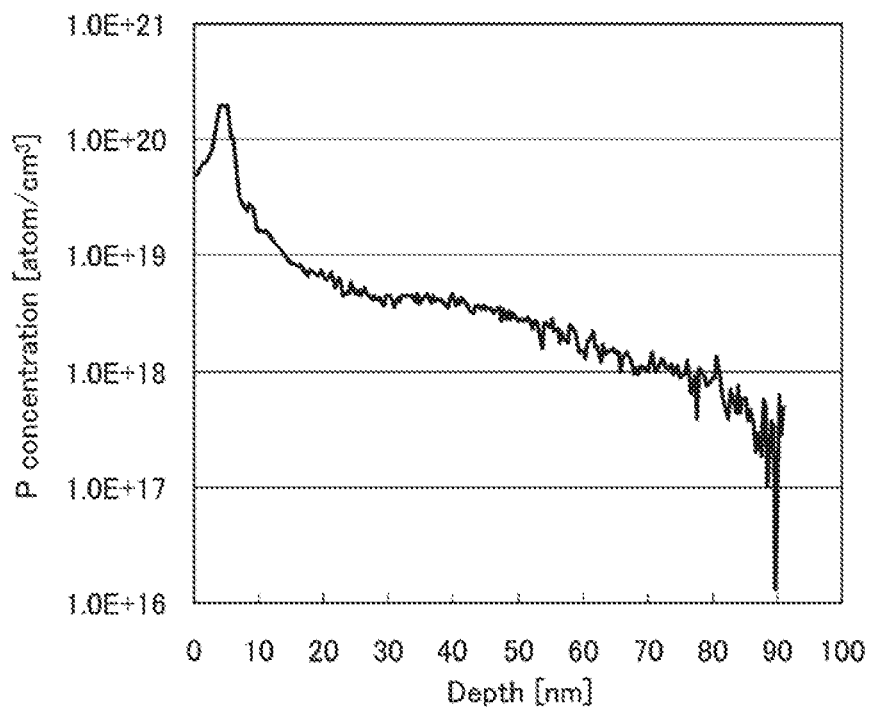
FIG. 14 is a graph showing the measurement result of SIMS in Comparative Example 2.

In order to investigate the concentration distribution of the impurity in silicon channel layer 7, the concentration distribution of phosphorus as the impurity was evaluated by SIMS along the depth direction starting from the outmost surface of silicon channel layer 7. The measurement result of SIMS in Comparative Example 2 was shown in FIG. 14. The maximal impurity concentration of $2 \times 10^{20}$ cm$^{-3}$ appeared at the part with a depth of 5 nm from the outmost surface of silicon channel layer 7. Further, the impurity concentration was found to change dramatically in the part with a depth of 5 to 20 nm in silicon channel layer 7, and the impurity concentration decreased slowly when the depth was 20 nm or more. Further, the impurity concentration at the part with a depth of 10 nm was $2 \times 10^{19}$ cm$^{-3}$, and the impurity concentration was $3 \times 10^{18}$ cm$^{-3}$ or less at the part with a depth of 45 nm or more.

The element was evaluated by using the same method as used in Example 1. The magnetoresistance ratio obtained from the measurement on magnetoresistance was 0.01%.

Comparative Example 3

The magnetoresistive element was manufactured in Comparative Example 3 by the same method described in Example 1 except for the following condition. Compared to Example 1, the average impurity concentration in the entire silicon channel layer was controlled at $1 \times 10^{19}$ cm$^{-3}$ in the first ion injection.

Figure 15:
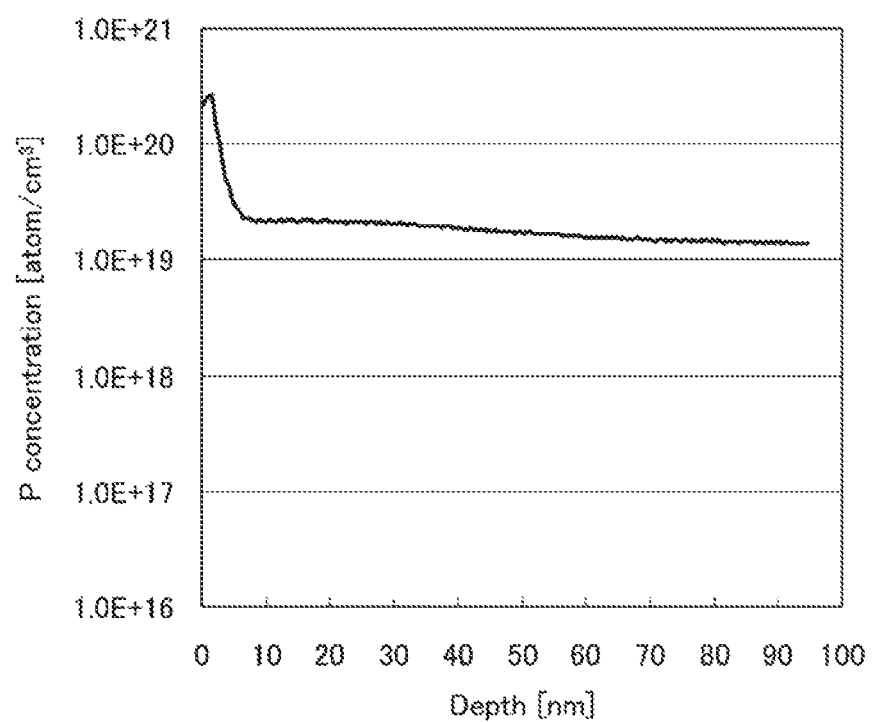
FIG. 15 is a graph showing; the measurement result of SIMS in Comparative Example 3.

In order to investigate the concentration distribution of the impurity ill Silicon channel layer 7, the concentration distribution of phosphorus as the impurity was evaluated by SIMS along the depth direction starting from the outmost surface of silicon channel layer 7. The measurement result of SIMS at Comparative Example 3 was shown at FIG. 15. The maximal impurity concentration of $2.5 \times 10^{20}$ cm$^{-3}$ appeared on the outmost surface of silicon channel layer 7. Further, the impurity concentration in silicon channel layer 7 was found to (Amigo dramatically from the outmost surface to the part with a depth of approximately 10 nm, but the impurity concentration decreased slowly when the depth as 10 nm or more. Further, the impurity concentration at the part with a depth, of 10 nm was $2.2 \times 10^{19}$ cm$^{-3}$, and the impurity concentration was $1.1 \times 10^{19}$ to $2.2 \times 10^{19}$ cm$^{-3}$ at the part deeper than it.

The element was evaluated by using the same method as used in Example 1. The magnetoresistance ratio obtained from the measurement on magnetoresistance was 0.05%.

Comparison Between Example 1 and Comparative Examples 1 to 3

With respect to Example 1 and Comparative Example 2, the distributions of the impurity were different in the vicinity of the interface between silicon channel layer 7 and the tunnel layer (first tunnel layer 81A and second tunnel layer 81B). In Example 1, the impurity concentration was the maximal on the outmost surface of silicon channel layer 7 and decreased with the increasing distance from the interface between silicon channel layer 7 and the tunnel layer. In Comparative Example 2, the distribution of the impurity was that the impurity concentration increased from the outmost surface of silicon channel layer 7, the impurity concentration became the maximal in the vicinity of silicon channel layer 7 with a depth of 5 nm, then the impurity concentration decreased. In other words, it indicated that a high magnetoresistance ratio could be provided with such a concentration distribution of the impurity that the impurity concentration was the maximal, level at the part of silicon channel layer 7 closest to the interface between silicon channel layer 7 and the tunnel layer.

Between Example 1 and Comparative Example 3, the impurity concentration was similarly distributed in first region 7A and second region 7B. However, in regions corresponding to third region 7C and fourth region 7D, the distributions of the impurity concentrations were different. In Example 1, the impurity concentration was $1\times10^{19}$ cm$^{-3}$ or less in the vicinity of the part with a depth of 6 nm from the outmost surface of silicon channel layer 7. In Comparative Example 3, the impurity concentration was $2.6\times10^{19}$ cm$^{-3}$ in the vicinity of the part with a depth of 6 nm from the outmost surface of silicon channel layer 7, and the impurity concentration did not decrease in the pan located even deeper. Thus, it could be known that the impurity concentration was preferably at least $1\times10^{19}$ cm$^{-3}$ or less in the third region and the fourth region so as to provide a high magnetoresistance ratio.

When comparing Example 1 with Comparative Example 1, the impurity concentration in silicon channel layer 7 decreased in a different way. In Example 1, the impurity concentration was the maximal on the outmost surface of silicon channel layer 7 located at the interlace between silicon channel layer 7 and the tunnel layer, and the impurity concentration decreased with the increasing distance from the outmost surface of silicon channel layer 7. In Comparative Example 1, the distribution of the impurity concentration was similar to that in Example 1 in first region 7A and second region 7B. However, in the configuration, a new peak in the distribution of the impurity concentration appeared in the region corresponding to third region 7C. Thus, it could be known that, in order to provide a high magnetoresistance ratio, it is preferable that the impurity concentration was the maximal on the outmost surface of silicon channel layer 7 located at the interface between silicon channel layer 7 and the tunnel layer, and the impurity concentration decreased with the increasing distance from the outmost surface of silicon channel layer 7.

Example 5

The magnetoresistive element was manufactured. In Comparative Example 5 by the same method described in Example 1 except for the following condition. Compared to Example 1, an experiment was performed in which the areal resistance (RA) between silicon channel layer 7 and pinned layer 12A and free layer 12B was changed by changing the film thickness of the magnesium oxide film in the range from 0.84 to 1.84 nm.

As shown in FIG. 16, first reference electrode 20A and second reference electrode 20B were newly arranged on the outer sides of pinned layer 12A and free layer 12B. In addition, the material for first reference electrode 20A and second reference electrode 20B was the non-magnetic metallic, material showing as low interfacial resistance with silicon channel layer 7. For example, the material could be aluminum or the like.

The magnetoresistance ratio was similarly measured as in Example 1. The current here for the measurement was 1 mA. In addition, the interfacial resistance between free layer 12B and silicon channel layer 7 (second region 7B) was measured as follows. Free layer 12B was taken as the electrode for both the current and the voltage. One of the current terminals and one of the voltage terminals were connected to free layer 12B. The other of the current terminals was connected to reference electrode 20A, and the other of the voltage terminals was connected to reference electrode 20B. Based on the voltage observed at that time, the areal resistance between free layer 12B and silicon channel layer 7 (second region 7B) was determined. Similarly, pinned layer 12A was taken as the electrode for both the current and the voltage. One of the current terminals and one of the voltage terminals were connected to pinned layer 12A. The other of the current terminals was connected to reference electrode 20B, and the other of the voltage terminals was connected to reference electrode 20A. Based on the observed voltage at that time, the areal resistance between pinned layer 12A and silicon channel layer 7 (first region 7A) was determined.

The magnetoresistance ratio and the areal resistance with respect to the film thickness of the magnesium oxide film were shown in Table 1. The film thicknesses were designed values. In each example of the film thicknesses, the areal resistance between free layer 12B and silicon channel layer 7 was almost equal to that between pinned layer 12A and silicon channel layer 7.

TABLE 1

| | | | | | | | | | |
|---|---|---|---|---|---|---|---|---|---|
| Thickness of MgO film [nm] | 0.84 | 1.04 | 1.21 | 1.31 | 1.56 | 1.58 | 1.67 | 1.80 | 1.84 |
| MR ratio [%] | 2.423 | 3.234 | 3.739 | 4.600 | 3.483 | 2.038 | 1.293 | 0 | 0 |
| RA between pinned layer and first region [$\Omega \cdot \mu m^2$] | 4.0E+02 | 2.0E+03 | 7.0E+03 | 1.4E+04 | 9.0E+04 | 1.0E+05 | 2.0E+05 | 1.0E+06 | 7.0E+06 |
| RA between free layer and second region [$\Omega \cdot \mu m^2$] | 4.0E+02 | 2.0E+03 | 7.0E+03 | 1.4E+04 | 9.0E+04 | 1.0E+05 | 2.0E+05 | 1.0E+06 | 7.0E+06 |

Figure 17:
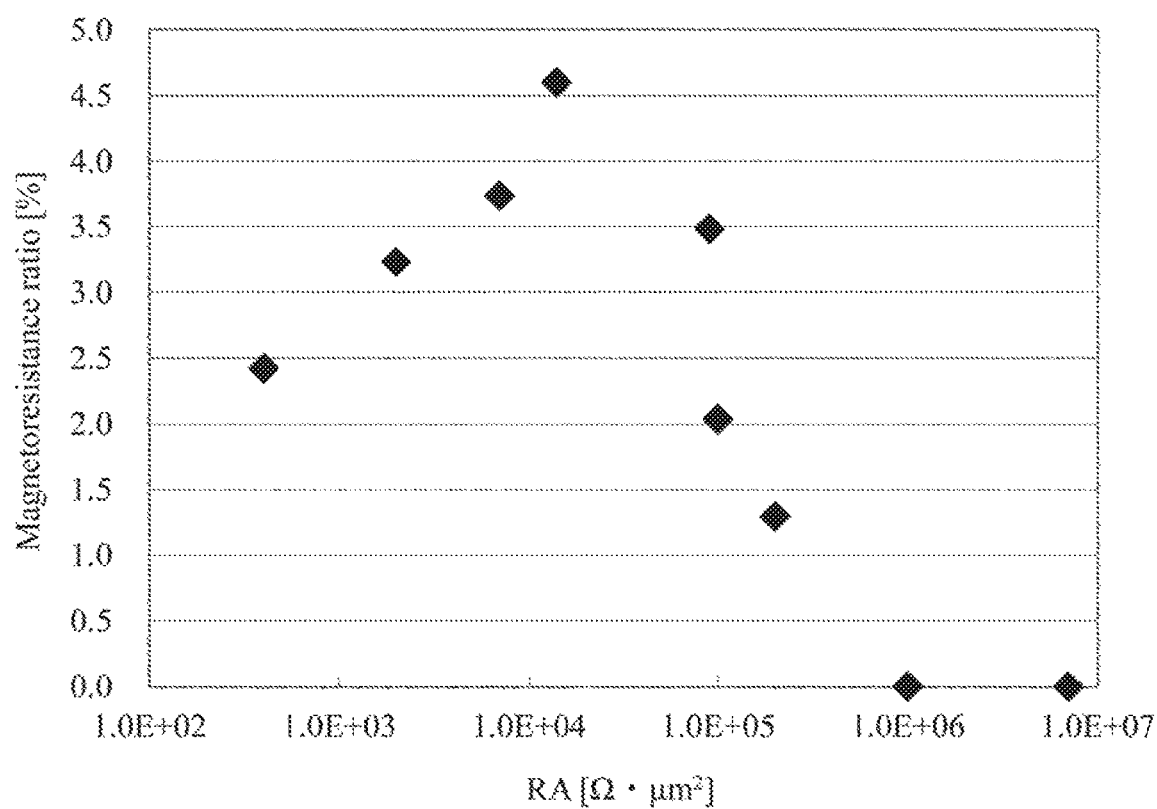
FIG. 17 is a graph showing the relationship between the magnetoresistance ratio and the areal resistance in Example 5.

FIG. 17 was a graph showing the relationship between the magnetoresistance ratio and the areal resistance between free layer 12B and silicon channel layer 7. The magnetoresistance effect could be hardly observed when the areal resistance was $1\times10^6$ $\Omega \cdot \mu m^2$ or higher. Thus, it could be seen that the areal resistance between free layer 12B and silicon channel layer 7 (second region 7B) and that between pinned layer 12A and silicon channel layer 7 (first region 7A) were preferably lower than $1\times10^6$ $\Omega \cdot \mu m^2$.

As described above, the magneto resistance effect occurred in the magnetoresistive elements in Example 1 and Example 5 caused by the relative angle formed by the magnetization orientation of pinned layer 12A and that of free layer 12B, and the work of MOSFET exhibited by applying the gate voltage. Further, the change of the magneto resistance effect depending on the gate voltage was also shown, and the elements in Example 1 and Example 5 functioned as Spin-MOSFETs The element in Example 5 could also be used as the spin-transport element using the pure spin current, wherein, the element in Example 5 was obtained by newly arranging first reference electrode 20A and second reference electrode 20B on the outer sides of pinned layer 12A and free layer 12B in the magnetoresistive element of Example 1. It could function as the spin-transport element using the pure spin currently, for example, arranging the current source to connect pinned layer 12A and first reference electrode 20A, flowing, the current to the part between pinned layer 12A and first reference electrode 20A via silicon channel layer 7, and arranging the voltmeter for measuring the voltage generated between pinned layer 12A and second reference electrode 20B.

DESCRIPTION OF REFERENCE NUMERALS 1 silicon substrate
2 silicon oxide film
3 semiconductor channel layer
7 silicon channel layer
7a first projection part
7b second projection part
7c main part of silicon channel layer
7A first region
7B second region
7C third region
7D fourth region
12A pinned layer
12B free layer
20A first reference electrode
20B second reference electrode
81A first tunnel layer
81B second tunnel layer
100 and 200 magnetoresistive element
500 spin-transport element

The invention claimed is:

1. A magnetoresistive element, comprising: a semiconductor channel layer,
   a pinned layer disposed on the semiconductor channel layer via a first tunnel layer, and a free layer disposed on the semiconductor channel layer via a second tunnel layer,
   wherein,
   the semiconductor channel layer comprises a first region, a second region, and a third region,
   the third region comprises a region and a fourth region,
   the first region and the first tunnel layer form a first interface, the second region and the second tunnel layer form a second interface,
   the first region, second region, and third region have the same conductivity type,
   the first region has an impurity concentration that is higher than 1×1019 cm-3, the second region has an impurity concentration that is higher than 1×1019 cm-3, and an the third region has an impurity concentration that is 1×1019 cm-3 or less,
   the first region and the second region are separated and connected by part of the third region,
   the region has a higher impurity concentration than the fourth region,
   the impurity concentrations in the first region and the second region decrease monotonically from the first and second interfaces toward the third region, respectively, and
   the impurity concentration in the region decreases monotonically from a boundary with the first region toward a boundary with the fourth region, the impurity concentration in the fourth region decreases monotonically away from a boundary with the region.

2. The magnetoresistive element according to claim 1, wherein,
   the first region and the second region have thicknesses of 10 nm or less.

3. The magnetoresistive element according to claim 1, wherein,
   the semiconductor channel layer comprises a first projection part and a second projection part, and
   the first region is contained in the first projection part and the second region is contained in the second projection part.

4. The magnetoresistive element according to claim 1, wherein,
   the maximal impurity concentrations in the first region and the second region range from $2\times10^{19}$ cm$^{-3}$ to $2\times10^{20}$ cm$^{-3}$.

5. The magnetoresistive element according to claim 1, wherein,
   the fourth region has an impurity concentration that is 3×1018 cm-3 or less.

6. The magnetoresistive element according to claim wherein,
   the areal resistance between the pinned layer and the first region and the areal resistance between the free layer and the second region are both lower than $1\times10^6$ Ω·μm$^2$.

7. A spin-transport element using pure spin current, comprising
   the magnetoresistive element according to claim 1,
   a first reference electrode which is made of non-magnetic material acid is disposed on a side closer to the pinned layer of outer sides of the pinned layer and the free layer, and
   a second reference electrode which is made of non-magnetic material and is disposed on a side closer to the free layer of outer sides of the pinned layer and the free layer.

8. A magnetoresistive element, comprising:
   a substrate,
   a semiconductor channel layer disposed on the substrate,
   a pinned layer disposed on the semiconductor channel layer via a first tunnel layer, and
   a free layer disposed on the semiconductor channel layer via a second tunnel layer, wherein,
   the semiconductor channel layer comprises a first region, a second region, and a third region,
   the third region comprises a region and a fourth region,
   the first region and the first tunnel layer form a first interface, the second region and the second tunnel layer form a second interface,
   the first region, second region, and third region have the same conductivity type,
   the first region has an impurity concentration that is higher than 1×1019 cm-3, the second region has an impurity concentration that is higher than 1×1019 cm-3, and the third region has an impurity concentration that is 1×1019 cm-3 or less, the first region and the second region are separated and connected by part of the third region, the region has a higher impurity concentration than the fourth region, the impurity concentrations in the first region and the second region decrease monotonically from the first and second interfaces toward the third region, respectively, and the impurity concentration in the region decreases monotonically from a boundary with the first region toward a boundary with the fourth region, the impurity concentration in the fourth region decreases monotonically toward the substrate.

9. The magnetoresistive element according to claim 8, further comprising, an insulating layer between the substrate and the third region.

* * * * *